(12) United States Patent
Beyer et al.

(10) Patent No.: US 11,309,191 B2
(45) Date of Patent: Apr. 19, 2022

(54) METHOD FOR MODIFYING SUBSTRATES BASED ON CRYSTAL LATTICE DISLOCATION DENSITY

(71) Applicant: Siltectra GmbH, Dresden (DE)

(72) Inventors: Christian Beyer, Freiberg (DE); Jan Richter, Dresden (DE); Ralf Rieske, Dresden (DE); Marko Swoboda, Dresden (DE); Albrecht Ullrich, Dresden (DE)

(73) Assignee: Siltectra GmbH, Dresden (DE)

( * ) Notice: Subject to any disclaimer, the term of this patent is extended or adjusted under 35 U.S.C. 154(b) by 0 days.

(21) Appl. No.: 16/532,988

(22) Filed: Aug. 6, 2019

(65) Prior Publication Data

US 2020/0051831 A1 Feb. 13, 2020

(30) Foreign Application Priority Data

Aug. 7, 2018 (DE) .......................... 102018006238.5

(51) Int. Cl.
*H01L 21/322* (2006.01)
*B23K 26/53* (2014.01)
(Continued)

(52) U.S. Cl.
CPC .......... *H01L 21/3221* (2013.01); *B23K 26/53* (2015.10); *B28D 5/0011* (2013.01); *H01L 21/78* (2013.01); *B23K 2101/40* (2018.08)

(58) Field of Classification Search
CPC ................. H01L 21/3221; H01L 21/78; H01L 21/02686; H01L 21/02035; H01L 22/12;
(Continued)

(56) References Cited

U.S. PATENT DOCUMENTS

2005/0205538 A1 9/2005 Li
2014/0038392 A1 2/2014 Yonehara et al.
(Continued)

FOREIGN PATENT DOCUMENTS

DE 102016201780 A1 8/2016
DE 102016208958 A1 12/2016
(Continued)

OTHER PUBLICATIONS

Klerks, Tobias, et al., "Flexible beam shaping system for the next generation of process development in laser micromachining", Lane 2016, 9th International Conference on Photonic Technologies.
(Continued)

*Primary Examiner* — Mohammed R Alam
(74) *Attorney, Agent, or Firm* — Murphy, Bilak & Homiller, PLLC

(57) ABSTRACT

A method includes: providing a semiconductor body having a generation plane and crystal lattice planes which intersect the generation plane at intersecting lines; generating modifications in the semiconductor body by multiphoton excitation and which are spaced apart from one another, the modifications altering a physical property of the semiconductor body so as to form subcritical cracks in the generation plane; and separating a solid-state layer from the semiconductor body by connecting the subcritical cracks in the generation plane.

25 Claims, 15 Drawing Sheets

(51) Int. Cl.
  *B28D 5/00* (2006.01)
  *H01L 21/78* (2006.01)
  *B23K 101/40* (2006.01)

(58) Field of Classification Search
  CPC .... B23K 6/53; B23K 2101/40; B23K 26/032; B23K 26/53; B23K 26/40; B23K 2103/56; B28D 5/0011; B28D 5/0064; B28D 5/0005; C30B 33/06; C30B 29/36
  See application file for complete search history.

(56) References Cited

U.S. PATENT DOCUMENTS

| | | |
|---|---|---|
| 2016/0052090 A1 | 2/2016 | Tanigawa |
| 2016/0354862 A1 | 12/2016 | Hirata |
| 2017/0151627 A1* | 6/2017 | Hirata .................. C30B 29/406 |
| 2017/0291255 A1 | 10/2017 | Hirata |
| 2017/0301549 A1 | 10/2017 | Suzuki |
| 2018/0108568 A1 | 4/2018 | Wang et al. |
| 2020/0398381 A1 | 12/2020 | Richter et al. |

FOREIGN PATENT DOCUMENTS

| | | |
|---|---|---|
| DE | 102017206178 A1 | 10/2017 |
| EP | 2599582 A1 | 6/2013 |
| JP | 2018078335 A | 5/2018 |
| WO | 2016083610 A2 | 6/2016 |

OTHER PUBLICATIONS

Manning, Ian, et al., "Large Area 4H SiC Products for Power Electronic Devices", Materials Science Forum, ISSN: 1662-9752, vol. 858, Revised: Nov. 20, 2015, pp. 11-14.

Watanabe, Ryosuke, et al., "Optical Properties of Spin-Coated TiO2 Antireflection Films on Textured Single-Crystalline Silicon Substrates", Hindawi Publishing Corporation, International Journal of Photoenergy, 2015, accessed online at https://www.hindawi.com/journals/ijp/2015/147836/ on Apr. 26, 2019.

Leonard, R.T., et al., "Exploration of Bulk and Epitaxy Defects in 4H-SiC Using Large Scale Optical Characterization", Material Science Forum, ISSN: 1662-9752, vol. 897, pp. 226-229.

* cited by examiner

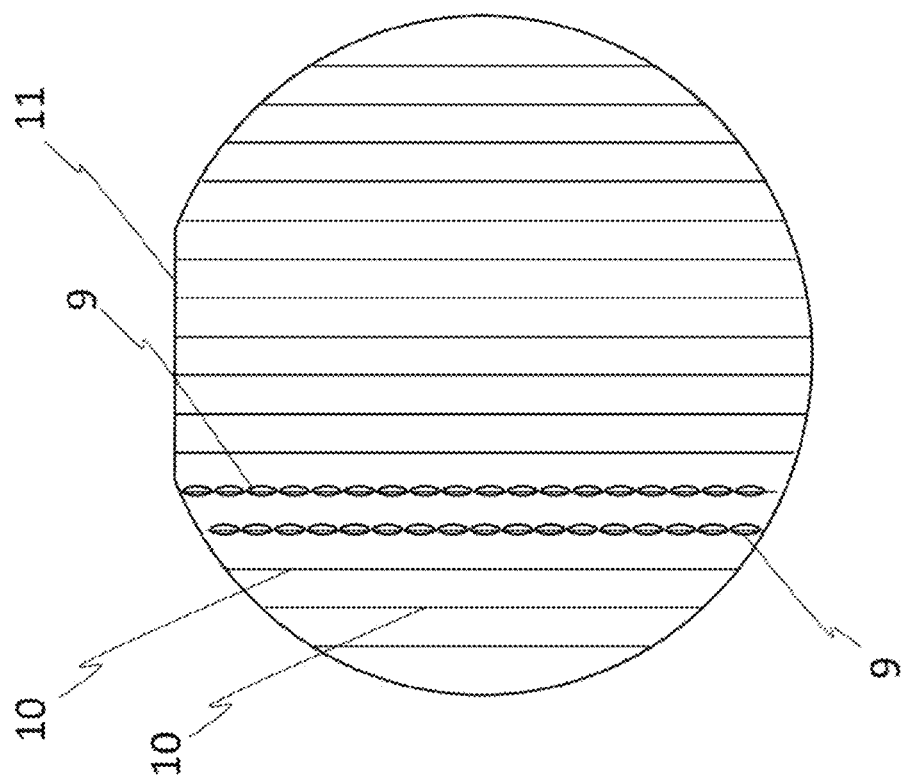
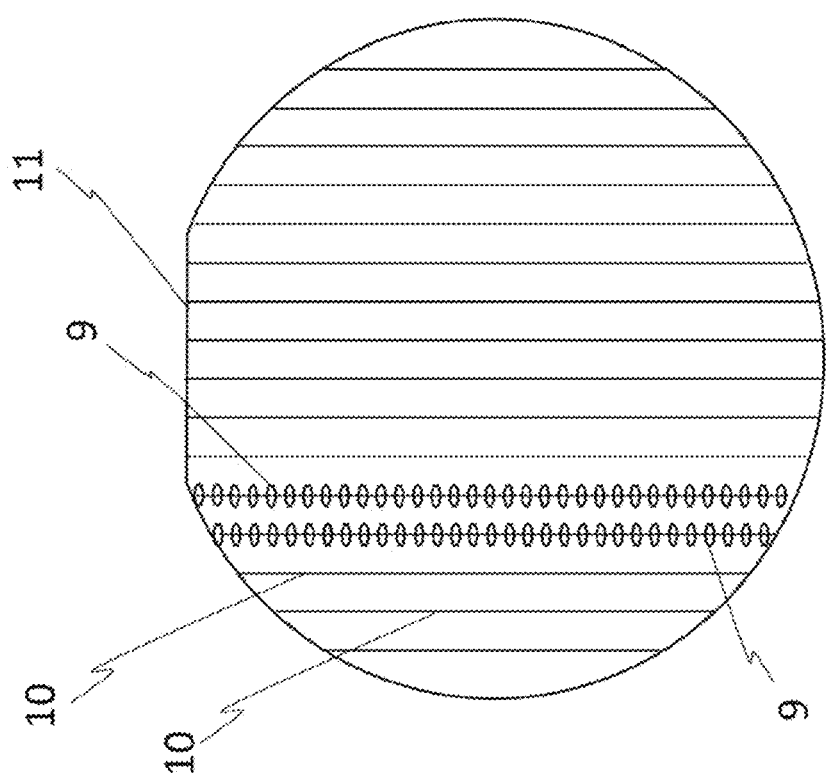

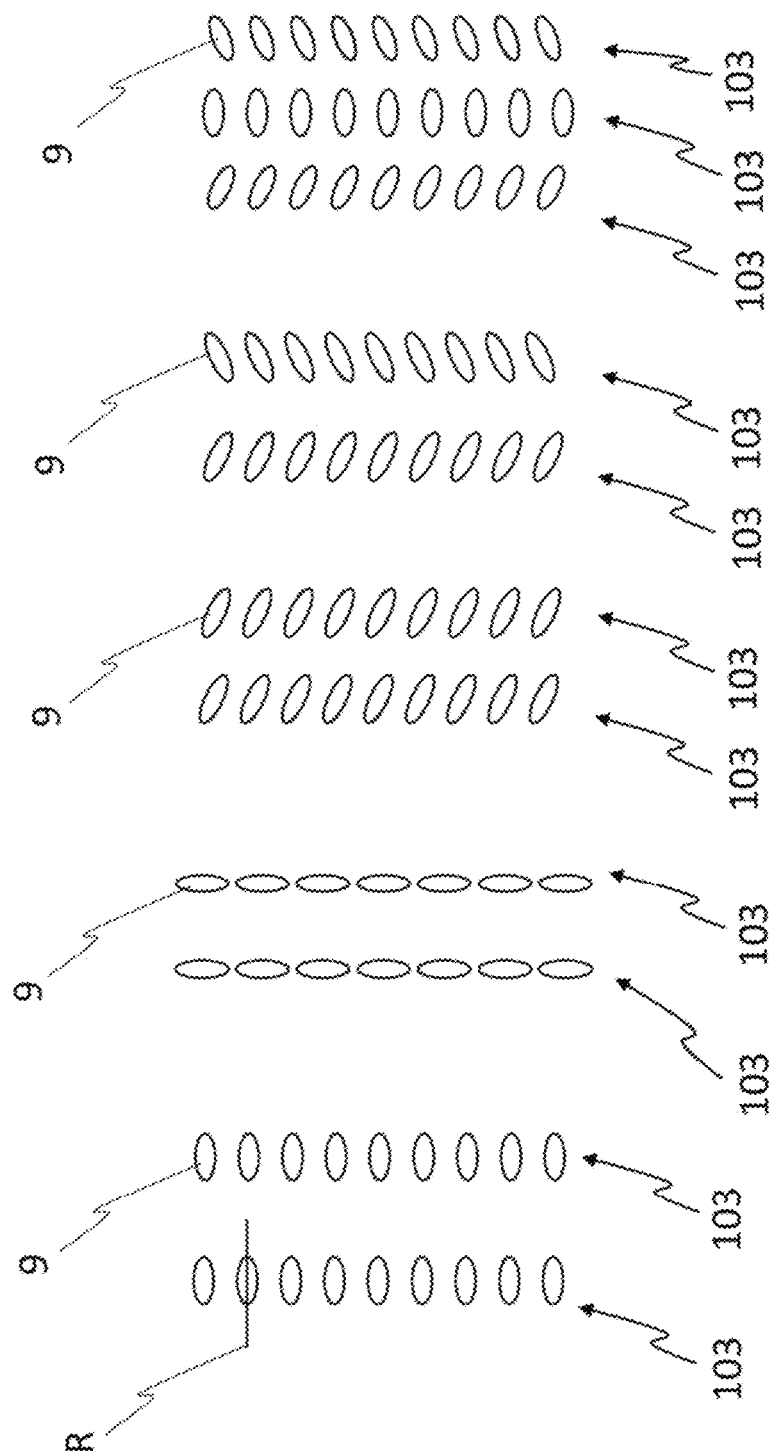

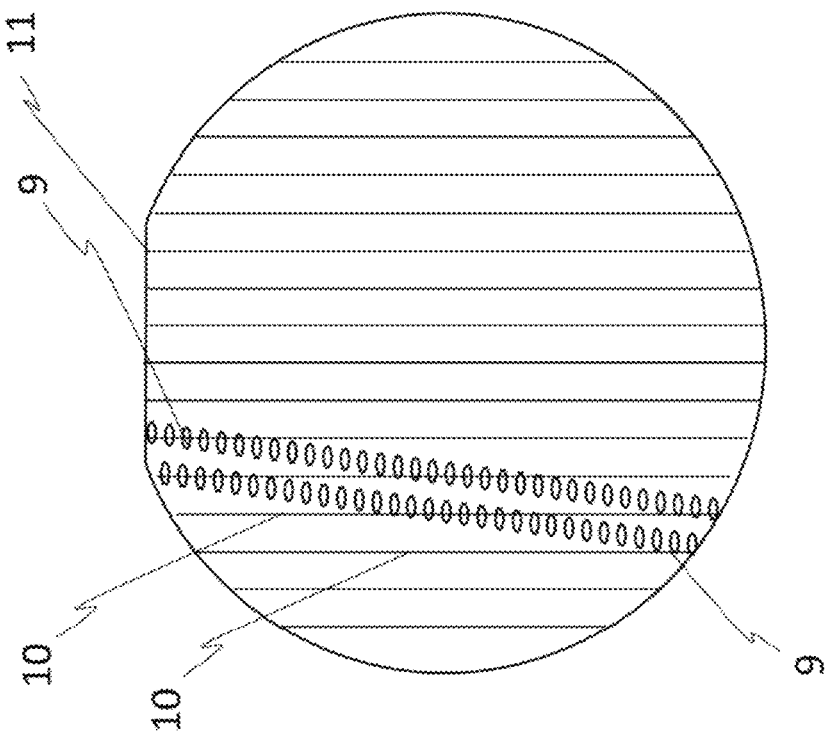
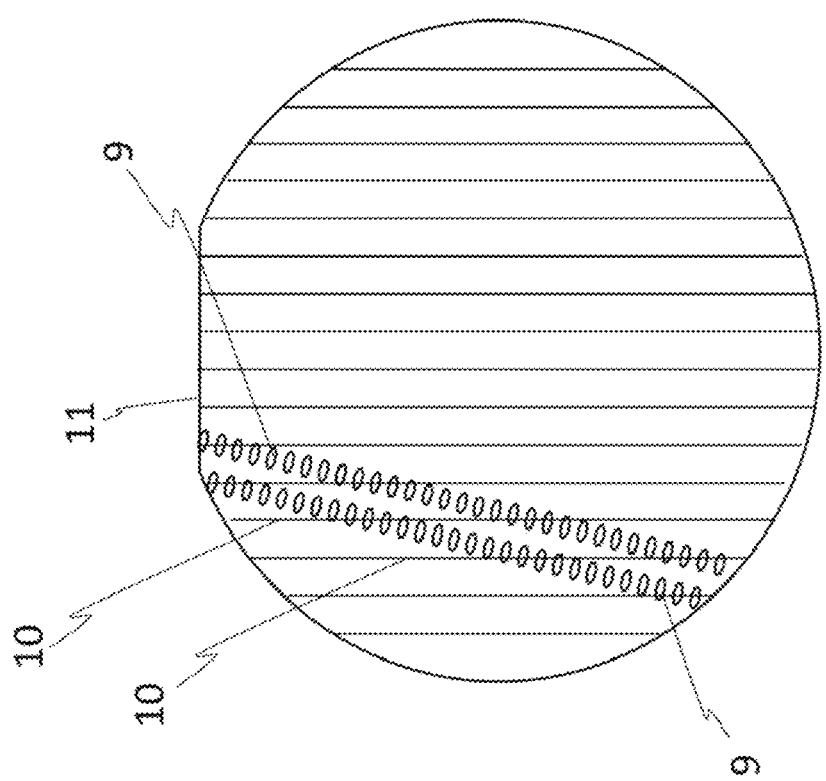

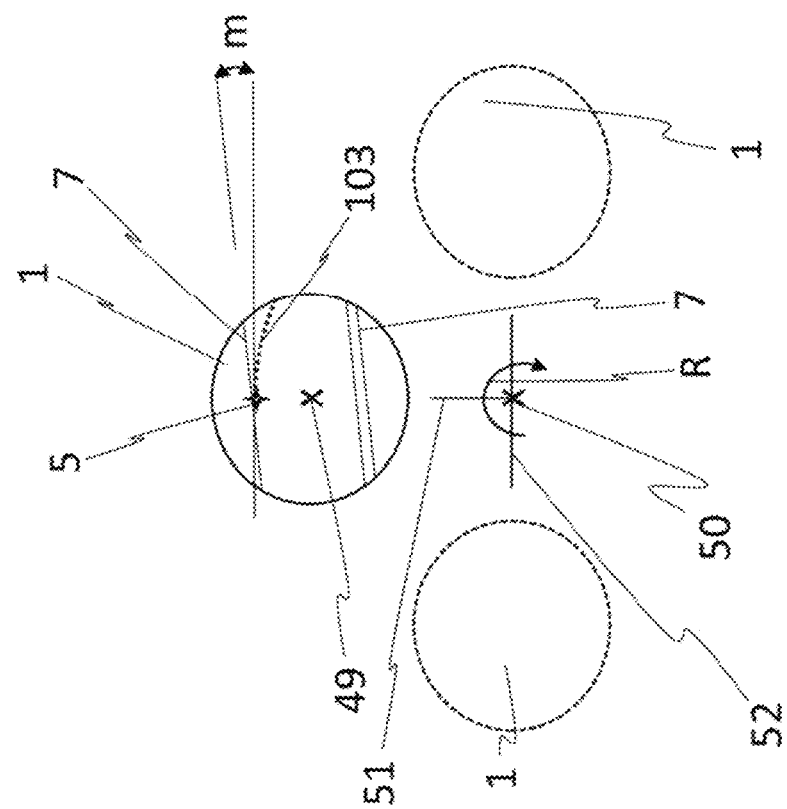
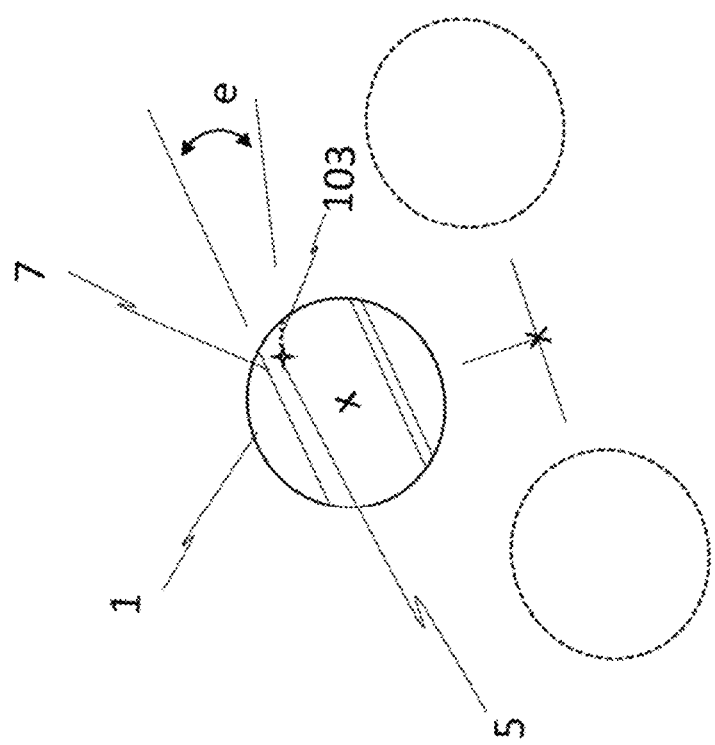
Fig. 9b
Fig. 9a

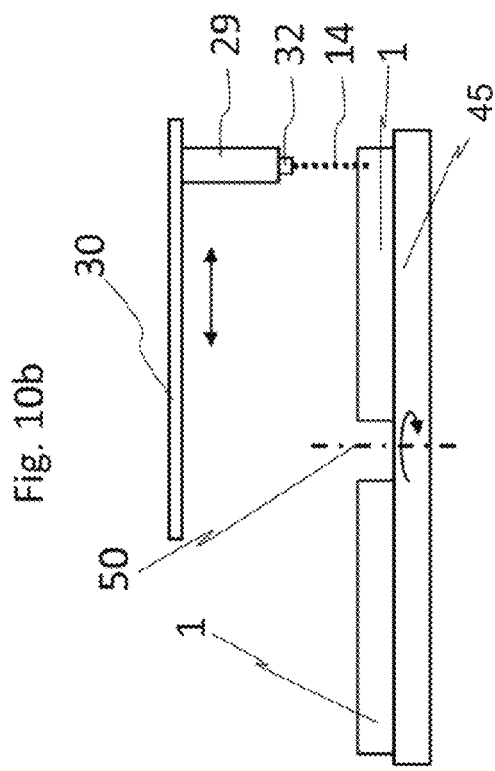
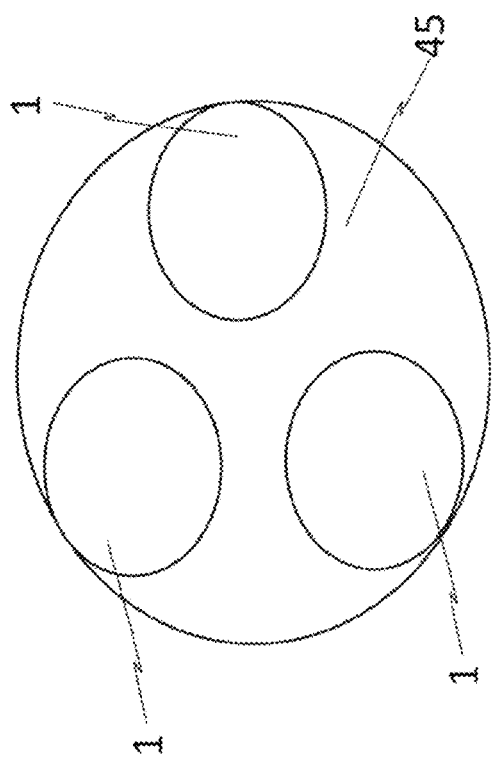
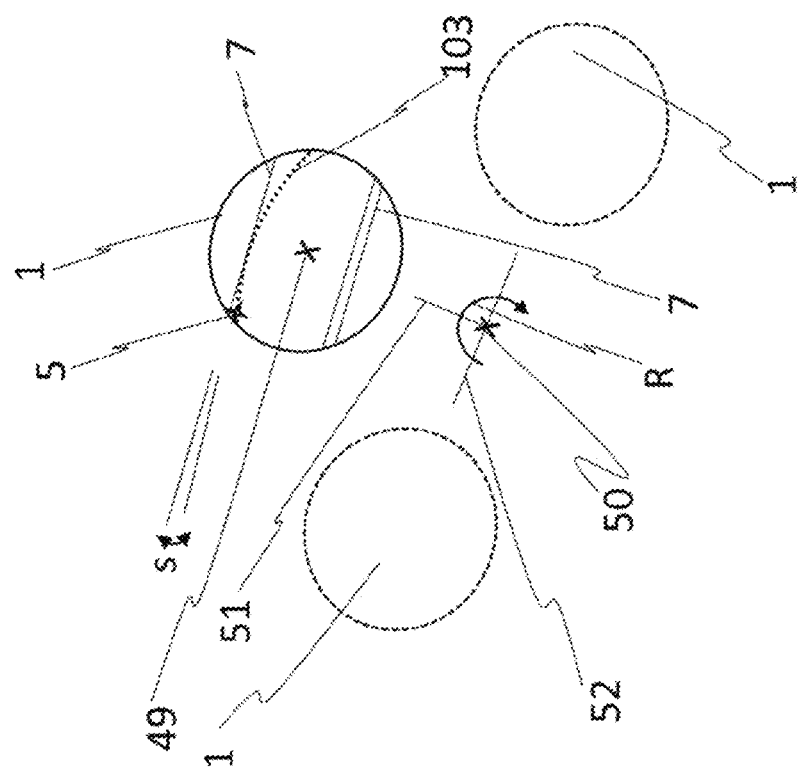

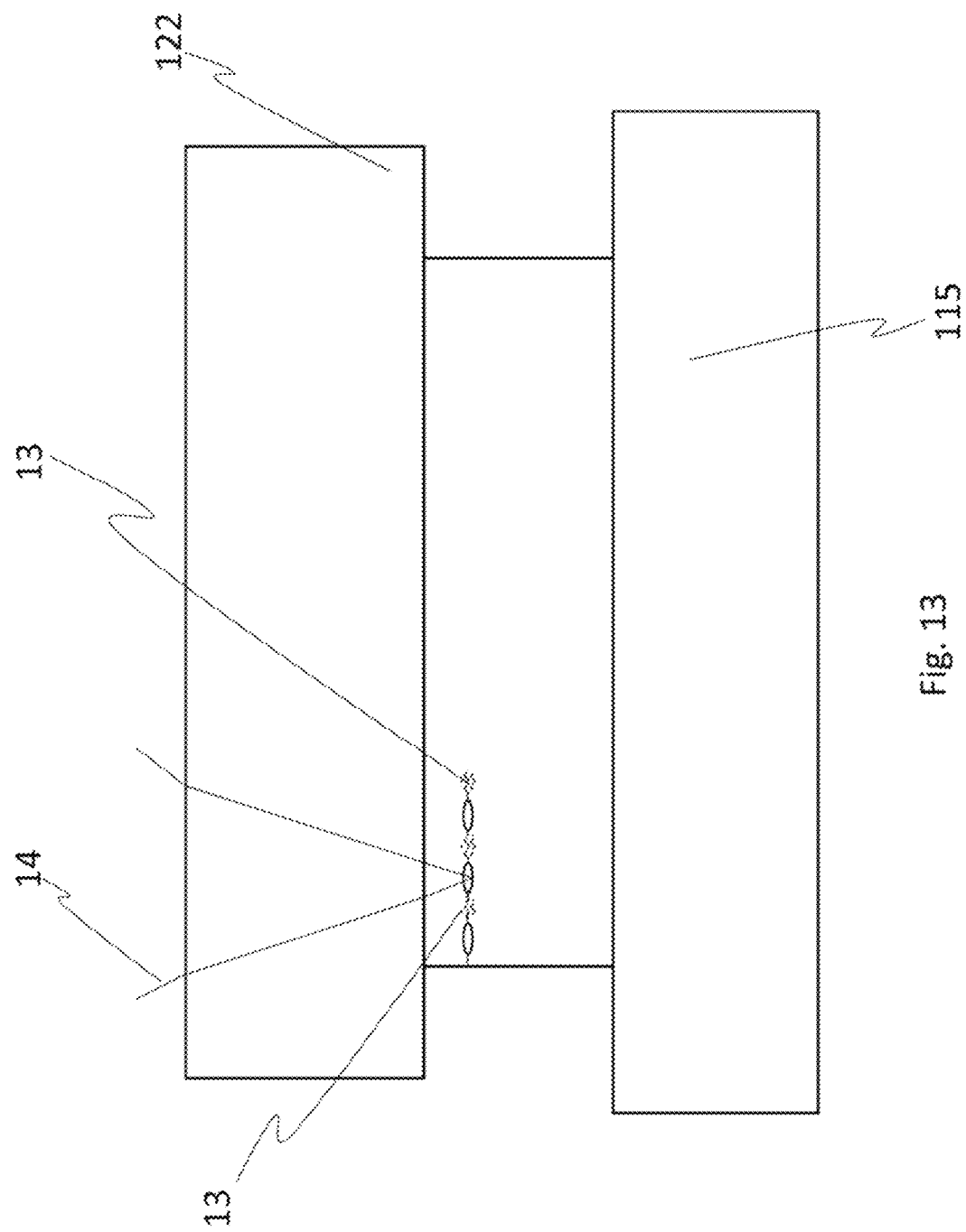

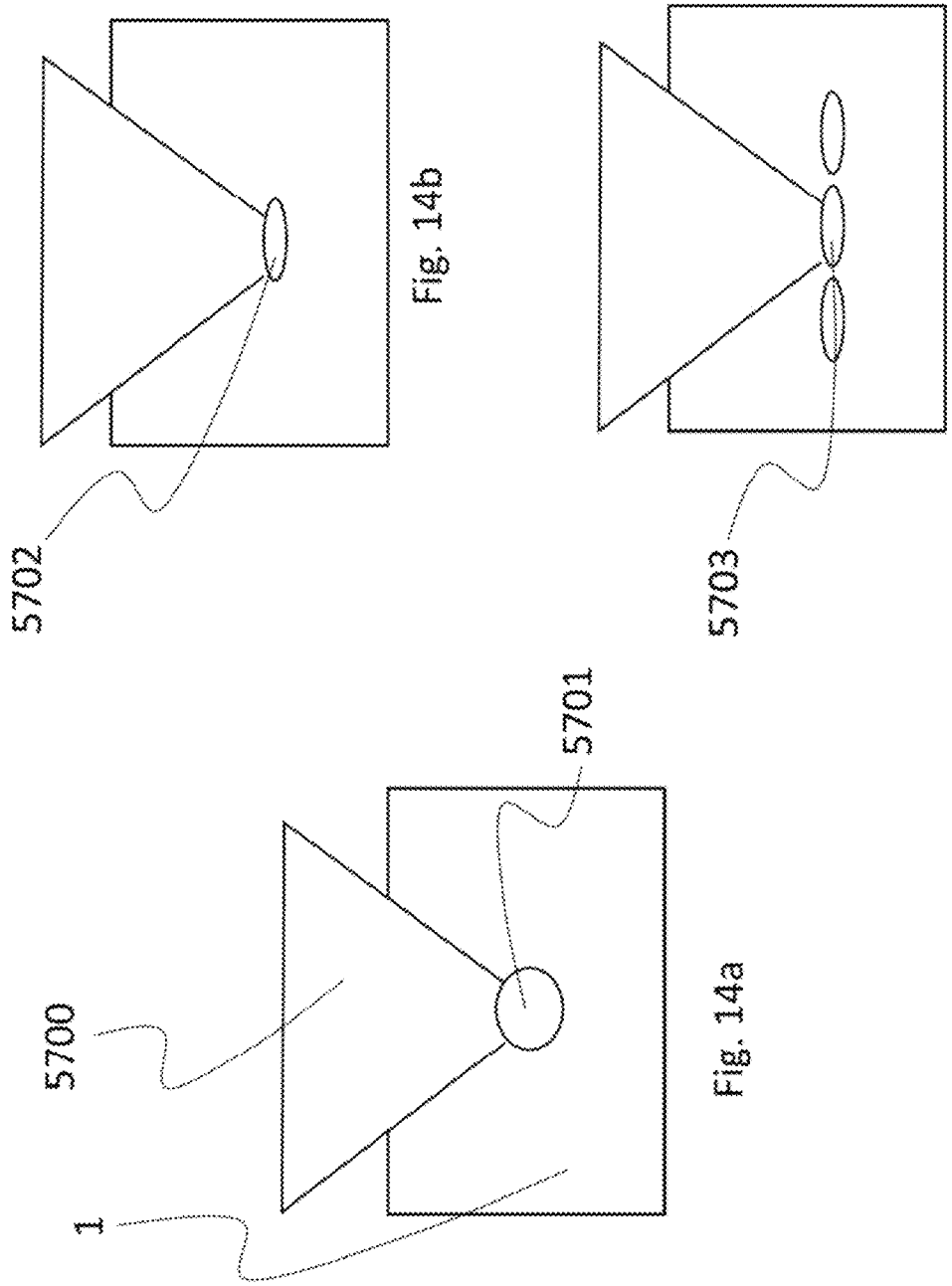

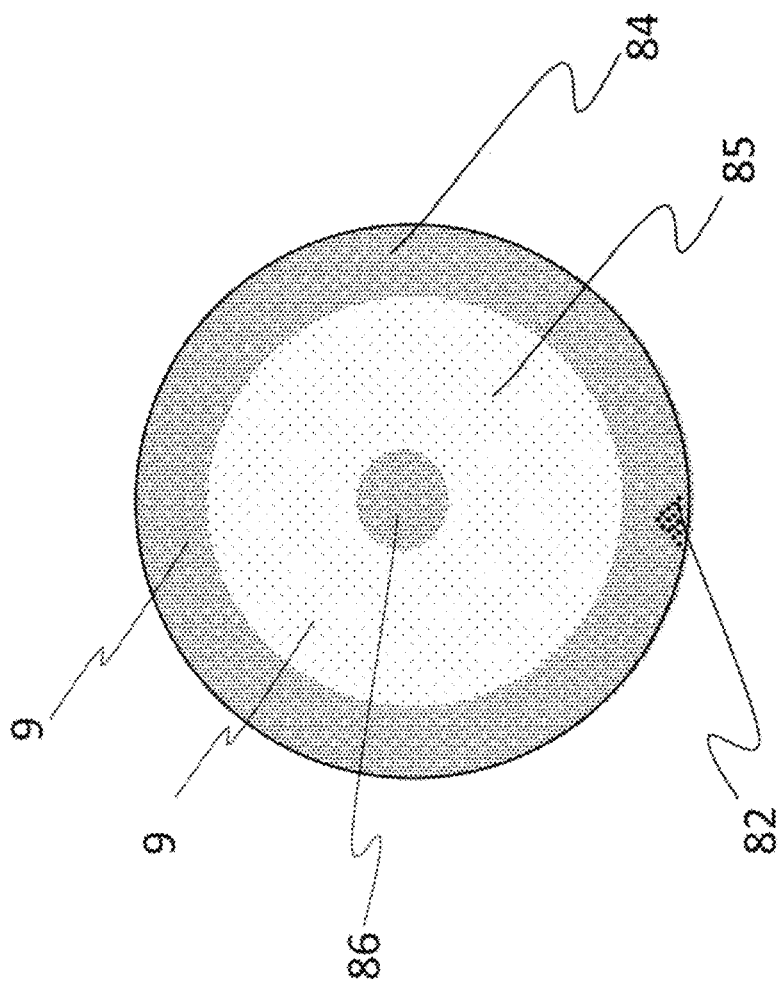

1

METHOD FOR MODIFYING SUBSTRATES BASED ON CRYSTAL LATTICE DISLOCATION DENSITY

BACKGROUND

Semiconductor materials are grown, for example, in large cylinders of crystalline material, referred to as ingots, while industrial processes often require wafer material with differences in thickness and surface quality. Wafering of brittle semiconductor materials is frequently carried out with diamond-based or slurry-based wire sawing processes. These sawing processes lead not only to cutting-gap loss of potentially useful material, but also to surface roughness and, below the surface, to damage to the crystal. These aspects of wafering by sawing processes necessitate polishing and grinding steps in the wafer manufacturing process, leading to additional damage and process costs.

To address these problems in the conventional wafering and thinning of semiconductors, so-called kerf-less technologies have been developed which promise a reduction in the cutting-gap losses, if not, indeed, the elimination of such losses, and also of damage below the surface and of grinding steps. So-called spalling processes, especially those situated externally, use stresses—often temperature-induced—to separate crystalline materials along crystal planes with well-defined thickness. Spalling may take place using nickel-chromium alloys, silver-aluminum paste, epoxy resin, aluminum, and nickel. Kerf-less wafering technologies have the potential for drastic reduction in damage within semiconductor fabrication processes. Stress-based separation methods, such as spalling (or splitting), use externally applied stresses in order to separate crystalline materials along their crystal planes with well-defined thickness. After the spalling, however, substrates exhibit what are called Wallner lines, which originate from crack propagation within the crystal.

Spalling was made possible using differences in the coefficients of thermal expansion between a brittle material and a polymer adhering on the surface of the material. Cooling of the conjoined materials below the glass transition temperature of the polymer induces stresses which lead to the material separating along a cracking plane. An advantage of this specific method in contrast to other modes of spalling is that the process of cooling does not give rise to any increased diffusion of unwanted chemical components through the material, in contrast to high-temperature methods which are also used for spalling.

Spalling processes, however, tend to be limited in their control over the wafer thickness attained, and tuning of the vertical locus of crack propagation is complicated. With spalling, furthermore, very prominent patterns of Wallner lines develop on the surface. This pattern is made up of streaklike grooves and elevations which originate from crack propagation within the semiconductor material and enable diversion of the cracking dynamic in the substrate. The crack typically begins at a certain point on the margin, and then propagates rapidly from the edge of the substrate. Wallner lines on conventional spalling surfaces greatly increase the resulting surface roughness, often to a point necessitating additional polishing or grinding steps before further processing and the production of circuits on the substrate.

The article "Large Area 4H SiC Products for power Electronic Devices", Material Science Forum, ISSN: 1662-9752, Vol. 858, pp 11-14, describes dislocation densities in solid-state SiC bodies.

The article "Exploration of Bulk and Epitaxy Defects in 4H-SiC Using Large Scale Optical Characterization", Material Science Forum, ISSN: 1662-9752, Vol. 897, pp 226-229 likewise describes dislocation densities in 4H-SiC.

The applicant's publication WO2016/083610 discloses laser-assisted separation of solid-state layers from donor substrates, more particularly examples of generation of modifications.

The publication DE102016201780A1 discloses a method wherein laser beams are used to generate cracks for the purpose of detaching a wafer in an ingot. The detachment takes place in dependence on an exposure to ultrasound. This process is deleterious because, owing to its operating parameters, it is very determinate and, moreover, necessitates a high level of rework, with the rework generating high costs and losses of material.

SUMMARY

The object of the present invention is to provide an improved method for modifying donor substrates and/or solid-state bodies, and an improved method for dividing modified donor substrates and/or solid-state bodies.

The aforesaid object is achieved in accordance with the invention by a method for generating microcracks in a donor substrate. This method of the invention preferably comprises at least the steps specified hereinafter: providing the donor substrate. The donor substrate may be referred to alternatively here as solid-state body or boule or thick wafer or ingot. The donor substrate preferably comprises or consists of a crystalline material. More preferably the donor substrate comprises or consists at least predominantly of or consists entirely of a single crystal. The donor substrate comprises crystal lattice planes, where at least one extent direction of the crystal lattice planes is oriented with an inclination relative to a planar major surface. Consequently, at least the majority and preferably at least 95% of the crystal lattice planes, and with particular preference all the crystal lattice planes, are oriented with an inclination relative to a planar major surface, at least in one extent direction of the crystal lattice planes. The major surface forms one boundary of the donor substrate in the longitudinal direction of the donor substrate. The major surface is formed in this case by the donor substrate. Generating modifications in the interior of the specific donor substrate, to form a detachment region in the interior of the donor substrate, by means of a laser facility. The modifications are more preferably generated by means of laser beams of the laser facility, where the laser beams with particular preference penetrate via the major surface into the donor substrate. The detachment region is preferably planar or substantially planar in configuration. The donor substrate is bounded, on the side opposite the major surface, by a further boundary surface. The detachment region is preferably generated or formed closer to the major surface than to the other boundary surface. The major surface and the further boundary surface are preferably oriented substantially or exactly parallel to one another.

This solution is advantageous because the modifications can be introduced into the donor substrate with great precision and in a short time.

The modifications in the context of the present invention may with particular preference be regarded as, and referred to as, local alterations in material.

Further preferred embodiments of the present invention are subjects of the subsequent parts of the description.

According to a further preferred embodiment of the present invention, the modifications are generated along a line, more particularly dotted line/s or line/s generated from dots, or two or more lines, more particularly parallel lines, to form modification lines, or where the modifications are generated to form one modification line or two or more modification lines, more particularly parallel modification lines, more particularly dotted line/s or line/s generated from dots. According to a further preferred embodiment of the present invention, the individual modifications generate compressive stresses in the donor substrate, whereby the donor substrate, by virtue of the modification line or the modification lines, undergoes cracking at least predominantly in the extent direction of the crystal lattice planes that is preferably inclined relative to the major surface.

According to a further preferred embodiment of the present invention, the modifications are generated per modification line in such a way that, in the case of more than M crystal lattice dislocations (per $cm^2$) in the donor substrate, the crack propagates less than 50 µm per modification line, in the extent direction of the crystal lattice planes that is inclined relative to the major surface, from the next point of the modification line or of the generation, or the modifications are generated per modification line in such a way that, in the case of fewer than O crystal lattice dislocations (per $cm^2$) in the donor substrate, the crack propagates more than 100 µm, more particularly more than 200 µm or more than 250 µm or more than 300 µm or more than 350 µm, per modification line in the extent direction of the crystal lattice planes that is inclined relative to the major surface, or the modifications are generated per modification line in such a way that in the case of more than O crystal lattice dislocations (per $cm^2$) in the donor substrate and fewer than M crystal lattice mismatches (per $cm^2$) in the donor substrate, the crack per modification line propagates between 50 µm and 100 µm, more particularly between 50 µm and 100 µm or 50 µm and 200 µm or 50 µm and 250 µm or 50 µm and 300 µm or 50 µm and 350 µm, in the extent direction of the crystal lattice planes that is inclined relative to the major surface. Here, with particular preference, O<M.

This solution is advantageous since it provides a treatment protocol for different qualities of material. Through this treatment protocol it is possible to divide donor substrates of different qualities reliably and with minor losses of material. The treatment protocol additionally or alternatively defines how longer cracks or longer subcritical cracks are to be provided in cases of increasing quality of material, i.e., of decreasing dislocation density. Conversely, where the quality of material is lower, i.e., where there is increasing dislocation density or crystal lattice dislocation density, shorter cracks are to be provided.

The cracks propagating around the modifications may also be referred here to as subcritical cracks. Subcritical cracks are cracks which are connected together only by a later main crack, and which, by connecting, divide the donor substrate, dividing it more particularly into a solid-state layer and the remaining solid-state body. Subcritical cracks may alternatively be referred to here also as microcracks.

The dislocations, or crystal lattice dislocations, can be visualized and counted by way of etching methods on a surface. The dislocation density should be understood preferably as the mean dislocation density over the face as a whole—the type of dislocations is more preferably "threading dislocation", referring to "penetrative dislocations" which "penetrate through a face" or extend to the surface (they can be seen, for example, by carrying out partial etching there). What this describes, accordingly, is a classification according to direction of dislocation in relation to the surface. Additionally or alternatively, the dislocations may be described or defined by the dislocation type (edge and/or screw dislocation).

An important mechanism of action is that the microcracks or subcritical cracks generated by the laser modification produce stresses in the interior of the solid-state body. These stresses cause the main crack to advance advantageously on the basis of the preliminary damage. The primary driver of this effect is that the vertical component of crack propagation is suppressed by the compressive stresses that have been introduced. The size of the stresses introduced here may be very heavily dependent on the length of the microcracks. For example, two short microcracks have a much lower stress than a single microcrack with a length corresponding to the sum of the lengths of the two short microcracks. The effect this produces is that the internal stress of numerous short cracks that is introduced is less than the stress of a few long cracks, even if the overall length of crack is the same in both cases. This can likewise be observed, for example, when the complete solid-state face experiences preliminary damage. In accordance with the invention, therefore, in crystals with a few dislocations and, consequently, a very high strength, preferably more internal stresses are generated in the solid-state body. This may be achieved in particular by microcracks which make up for their lack of numbers by being longer.

The stress needed in order to cause a microcrack to grow decreases in line with the size of the microcrack.

According to one preferred embodiment of the present invention, O is 250 $cm^{-2}$, more particularly 500 $cm^{-2}$ or 1000 $cm^{-2}$ or 2000 $cm^{-2}$ or 3000 $cm^{-2}$ or 4500 $cm^{-2}$. Additionally or alternatively, M is preferably 5000 $cm^{-2}$, more particularly 7500 $cm^{-2}$ or 10 000 $cm^{-2}$ or 12 500 $cm^{-2}$. This embodiment is advantageous because, depending on the dislocations in a donor substrate material, especially a specific boule or ingot, more particularly of a defined batch or manufacture, a defined crack propagation results or is generated.

According to a further preferred embodiment of the present invention, additionally or alternatively, the crack propagates in the extent direction of the crystal lattice planes, that is inclined relative to the major surface, as a function of the size of the individual modifications. Preferably at least the majority of the modifications are generated with a volume of less than A, or the modifications of one modification line are generated with a mean modification volume of less than A, if the number of crystal lattice dislocations (per $cm^2$) is greater than M, or at least the majority of the modifications are generated with a volume of greater than C, or the modifications of one modification line are generated with a mean modification volume of greater than C, if the number of crystal lattice dislocations (per $cm^2$) is less than O, or at least the majority of the modifications are generated with a volume of between A and C, if the number of crystal lattice dislocations (per $cm^2$) is between M and O. Here, with particular preference, A<C.

The size of a modification is preferably the volume of the modification. In the case of SiC, the blackening of the material, particularly the fractions of material that are altered by a physical transformation, represents the size or the volume of the modification.

This solution is advantageous since it provides a treatment protocol for different qualities of materials. Through this treatment protocol it is possible for donor substrates of different qualities to be divided reliably and with small losses of material. The treatment protocol here defines, additionally or alternatively, the provision of greater modification volumes as the quality of material goes up, i.e., as the dislocation density decreases. In the case of lower quality of material, conversely, i.e., increasing dislocation density, smaller modification volumes are to be provided.

According to one further preferred embodiment of the present invention, the volume A or the mean volume A is less than or equal to 100 μm³, more particularly less than or equal to 75 μm³ or less than or equal to 50 μm³ or less than or equal to 25 μm³, and/or the volume C is greater than or equal to 250 μm³, more particularly greater than or equal to 500 μm³ or greater than or equal to 750 μm³ or greater than or equal to 1000 μm³. This embodiment is advantageous because, depending on the dislocations in a donor substrate material, more particularly a specific boule or ingot, more particularly of a defined batch or manufacture, a defined modification volume or mean modification volume results or is generated.

In accordance with a further preferred embodiment of the present invention, additionally or alternatively, the crack propagates along the extent direction of the crystal lattice planes that is inclined relative to the major surface, in dependence on the laser energy provided for generating the respective modifications. Preferably at least the majority of the modifications are generated with a laser energy of less than D, or the modifications of one modification line are generated with a mean laser energy of less than D, if the number of crystal lattice dislocations (per cm²) is greater than M, or at least the majority of the modifications are generated with a laser energy of greater than E, or the modifications of one modification line are generated with a mean laser energy of greater than E, if the number of crystal lattice dislocations (per cm²) is less than O, or at least the majority of modifications are generated with a laser energy between D and E if the number of crystal lattice dislocations (per cm²) is between M and O. Here, with particular preference, D<E.

This solution is advantageous because it provides a treatment protocol for different qualities of materials. Through this treatment protocol it is possible for donor substrates of different qualities to be divided reliably and with small losses of material. The treatment protocol additionally or alternatively defines the provision of a greater laser energy, to be used in particular for the modification, in the case of increasing quality of material, i.e., decreasing dislocation density. Conversely, in the case of lower quality of material, i.e., increasing dislocation density, a lower laser energy is to be provided, and more particularly used for generating the modification.

According to a further preferred embodiment of the present invention, the laser energy per modification D or the mean laser energy per modification D is less than or equal to 10 μJ, more particularly less than or equal to 5 μJ or less than or equal to 3 μJ or less than or equal to 2 μJ, and/or the laser energy E or the mean laser energy E is greater than or equal to 30 μJ, more particularly greater than or equal to 50 μJ or greater than or equal to 100 μJ or greater than or equal to 200 μJ. This embodiment is advantageous because, depending on the dislocations in a donor substrate material, more particularly a specific boule or ingot, more particularly of a defined batch or manufacture, a defined laser energy or mean laser energy results or is generated.

According to a further preferred embodiment of the present invention, additionally or alternatively, a multiplicity of modification lines parallel to one another are generated, where the distance between immediately adjacent modification lines, at least in the case of the majority of the modification lines, is less than J in the case of more than M crystal lattice dislocations (per cm²) or is greater than K in the case of fewer than O crystal lattice dislocations (per cm²), or is between J and K in the case of fewer than M crystal lattice dislocations (per cm²) and more than O crystal lattice dislocations (per cm²). Here, with particular preference, J<K.

This solution is advantageous since it provides a treatment protocol for different qualities of material. Through this treatment protocol, donor substrates of different qualities can be divided reliably and with small losses of material. The treatment protocol here additionally or alternatively defines the provision of larger distances between each pair of immediately adjacent modification lines in the case of increasing quality of material, i.e., decreasing dislocation density. Conversely, in the case of lower quality of material, i.e., increasing dislocation density, smaller distances are to be provided between respective pairs of immediately adjacent modification lines.

According to a further preferred embodiment of the present invention, the distance J is less than or equal to 50 μm, more particularly less than or equal to 40 μm or less than or equal to 25 μm or less than or equal to 10 μm, and/or the distance K is greater than or equal to 80 μm, more particularly greater than or equal to 100 μm or greater than or equal to 150 μm or greater than or equal to 250 μm. This embodiment is advantageous because, depending on the dislocations in a donor substrate material, more particularly a specific boule or ingot, more particularly of a defined batch or manufacture, a defined distance between respective pairs of immediately adjacent modification lines results or is generated.

A further important mechanism of action is that the laser modifications hinder the solid-state body from cracking open. This effect may arise because the modifications are preferably situated exactly where the solid-state body or donor substrate is intended to slip along the microcracks. The running dislocations of the fracture may indeed propagate very well along these microcracks, but at some point inevitably encounter the modification which caused the microcracks to develop. Within the modification, obviously, the crystal structure is destroyed, and so the fracture is unable to slip further along the existing fracture plane. Instead, the fracture has to go around the modification. This may happen, for example, by the fracture running on along a surface of the modification, in the vicinity of the interface between the material with phase transformation and the "normal" crystal. In this case, the situation arises that the material of the phase transformation becomes associated primarily with one particular side of the fracture face; more particularly, the material of the phase transformation is located primarily on the boule side and less on the wafer side. Going around the laser modification requires extra energy, and it is therefore advantageous to generate the laser modifications themselves at further distance from one another, particularly if the material possesses a high strength as a result of few dislocations. This may occur, for example, by the line distance of the modifications being adapted to the quality of crystal. More particularly, a greater distance of the modifications in the case of lower dislocation densities.

Another possibility is that of forming fewer modifications within a line, in other words increasing the distance between two modifications along a working section. Advantageous here are distances of >10 μm and/or >15 μm, and/or >20 μm and/or >30 μm, but more particularly preferably <500 μm or preferably <300 μm.

According to another preferred embodiment of the present invention, the modifications are generated on a generation plane, more particularly on at least one generation plane or on exactly one generation plane, and the crystal lattice planes of the donor substrate are preferably oriented with an inclination relative to the generation plane, more particularly at an angle of between 0.1° and 10°, more particularly between 1° and 6°, more particularly between 2° and 4°, or at an angle of 2° or 4°, where preferably a crystal lattice plane normal is inclined in a first direction relative to a major-surface normal. The modification lines here are preferably oriented with an inclination relative to an intersecting line which arises at the intersection between the generation plane and the crystal lattice plane. The angle in this case is preferably unequal to 0° and unequal to 90° and unequal to 180° and unequal to 270° and unequal to 360°. This embodiment is advantageous because preferably each modification intersects a different collective of crystal lattice planes. The effect of this is that the probability increases, or is very high, that the cracks propagate only with a predefined length.

According to a further preferred embodiment of the present invention, additionally or alternatively, the modification lines are oriented with an inclination relative to the intersecting line arising at the interface between the generation plane and the crystal lattice plane, at an angle smaller than the angle P or at an angle greater than the angle Q or at an angle between P and Q. The modification lines here are generated preferably at an angle smaller than the angle P if the number of crystal lattice dislocations (per $cm^2$) is greater than M, or the modification lines are generated at an angle greater than the angle Q if the number of crystal lattice dislocations (per $cm^2$) is less than O, or the modification lines are generated at an angle between the angles P and Q if the number of crystal lattice dislocations (per $cm^2$) is between M and O.

This solution is advantageous since it provides a treatment protocol for different qualities of material. Through this treatment protocol, donor substrates of different qualities can be divided reliably and with low losses of material. This treatment protocol additionally or alternatively defines the generation of the modification lines preferably at an angle greater than the angle Q relative to the intersecting line, in the case of increasing quality of material, i.e., decreasing dislocation density. Conversely, in the case of lower quality of material, i.e., increasing dislocation density, the modification lines are generated preferably at an angle smaller than the angle P relative to the intersecting line.

According to a further preferred embodiment of the present invention, the angle P is less than or equal to 10°, more particularly less than or equal to 8° or less than or equal to 6° or less than or equal to 4°, and/or the angle Q is greater than or equal to 10°, more particularly greater than or equal to 15° or greater than or equal to 20° or greater than or equal to 25°. This embodiment is advantageous because, depending on the dislocations in a donor substrate material, more particularly a specific boule or ingot, more particularly of a defined batch or manufacture, a defined angle between the modification lines and the intersecting line results or is generated.

According to a further preferred embodiment of the present invention, the donor substrate comprises or consists of SiC or the donor substrate comprises or consists of sapphire ($Al_2O_3$). This solution is advantageous since both materials are very hard and therefore low-loss separation methods on such materials are the most efficient, owing to the hardness of material.

The modifications which belong to the same linear architecture or writing line or points line or modification line and are generated in succession are preferably generated at a distance from one another which is defined by the function $(d-x)/d < -0.31$, more particularly $< -0.4$, where preferably $x > d$.

At the level of the generation plane or modification plane, or preferably parallel thereto, the subcritical cracks can propagate and so form a detachment plane. The detachment plane may therefore be nearer than the generation plane to the first surface, or the detachment plane may be further than the generation plane from the first surface. Preferably the entirety or the majority of the modifications are generated preferably on one plane, specifically the generation plane.

"In the region" of the modification may be understood here to mean that the solid-state body or the donor substrate undergoes cracking in the modified or transformed-material fraction and in the solid-state fraction adjacent thereto. It is, however, likewise possible for the modified region not to undergo cracking, and for the crack instead to crack in the longitudinal direction of the solid-state body, above or below the modification/s. If the solid-state body cracks above or below the modification/s, then the distance between the crack (more particularly the subcritical crack) and the generation plane is preferably less than 20 μm, more particularly less than 15 μm or less than 10 μm or less than 5 μm or less than 4 μm or less than 3 μm or less than 2 μm or less than 1 μm.

This solution is advantageous because the stated condition $(d-x)/d < -0.31$ defines the focal points of the successively generated modifications of the same linear architecture as being at a distance from one another such that the transformation of material generated beforehand produces little or no effects, more particularly little or no increase in absorption, in the case of the following transformation of material. This is advantageous because the modifications consequently can be generated with great precision, thereby allowing more effective control over the tendency of subcritical cracks or microcracks to propagate more strongly.

According to a further preferred embodiment of the present invention, the laser radiation is of defined polarization. The direction of polarization of the laser radiation here is oriented preferably at a defined angle, more particularly a fixed angle of 0° or 90°, or in a defined angle range, more particularly −20° to 20° or −10° to 10° or −5° to 5° or −1° to 1° or 70° to 110° or 80° to 100° or 85° to 95° or 89° to 91°, relative to the crystal axis of the solid-state body. Alternatively, the direction of longitudinal extent of the modifications generated by means of the laser beams in the interior of the solid-state body may be oriented at a defined angle, more particularly a fixed angle of 0° or 90°, or in a defined angle range, more particularly −20° to 20° or −10° to 10° or −5° to 5° or −1° to 1° or 70° to 110° or 80° to 100° or 85° to 95° or 89° to 91°, relative to an intersecting line, more particularly virtual intersecting plane, that arises at the intersection between the generation plane and the crystal lattice plane.

In the case of polarization of the laser parallel to the major flat, it has been observed, on laser machining into the C side of the SiC substrate, that a laser energy greater by around 50% is required in order to form comparable damage patterns, relative to a laser polarization perpendicular to the major flat in this configuration. If circularly polarized light is used, then the laser power transmitted in a polarizer, in contrast to pass polarization, is reduced by ⅓. This means that for circularly polarized light, the laser energy utilized relative to the linear ideal polarization must probably be increased by an amount of up to 50%. This difference, however, may also be smaller, in particular owing to the nonlinearity of the process and to the active cross sections for multiphoton effects in SiC for circularly polarized light. A value between the threshold energies for ideal laser polarization and laser polarization rotated by 90° in relation thereto is also possible, accordingly, since both polarizations occur transiently in the course of the rotating laser polarization. Multiphoton effects, however, usually have better active cross sections for linearly polarized light, and so even greater energies have to be expended for perfectly circularly polarized light.

According to a further preferred embodiment of the present invention, modifications which belong to the same linear architecture and are generated in succession are generated at a distance from one another which is defined by the function (d−x)/d<0, more particularly <−0.3 or <−0.31 or <−0.4 or <−0.45 or <−0.5 or <−0.55 or <−0.6 or <−0.65 or <−0.7 or <−0.75, where here, preferably x>d. The statement <−0.31 here means less than −0.31, the numbers in question here being numbers greater in terms of amount, such as −0.5, for example. In contrast, in terms of amount, −0.1 is smaller than the amount of −0.31, and therefore −0.1 would not be encompassed.

According to a further preferred embodiment of the present invention, the successively generated modifications of one linear architecture are separated from one another by unmodified solid-state material. In other words, the phase change brought about by laser modification preferably does not take place between individual modifications. The individual modifications of one linear architecture are therefore preferably separated from one another spatially to an extent such that a material transformation that has taken place beforehand has no effect on the absorption in the case of a modification generated immediately thereafter for the same linear architecture. This therefore results in a points pattern, or the linear architecture is formed by a points pattern.

According to a further preferred embodiment of the present invention, a first part of the modifications generated in the solid-state body are generated during a first relative movement of the solid-state body relative to an optics of the laser, and a second part are generated during a second relative movement of the solid-state body relative to the optics of the laser. The first relative movement here is preferably a straight-line movement in a first direction, and the second relative movement is preferably a straight-line movement in a second direction, with the traversal pathways preferably being parallel to one another. With preference the entire travel pathway forms a meander shape, or a travel movement produced by an X-Y table.

At least the setting of one laser parameter, particularly the polarization, according to a further preferred embodiment, during the first relative movement deviates from the setting during the second relative movement, with the first relative movement corresponding to a linear movement in a first direction and the second relative movement corresponding to a linear movement in a second direction, where the first direction and the second direction are oriented with parallel offset relative to one another.

The laser radiation according to one further preferred embodiment of the present invention is linearly polarized or elliptically polarized or circularly polarized. This embodiment is advantageous because a defined polarization of the laser radiation allows modifications to be generated that enable very short crack propagation—more particularly shorter than 100 µm—of the subcritical cracks.

According to another preferred embodiment of the present invention, the method likewise preferably comprises the step of altering a beam property of the laser beams before penetration of the solid-state body, where the beam property is the intensity distribution in the focus, where the alteration or adaptation of the beam property is produced by at least one or exactly one spatial light modulator and/or by at least one or exactly one DOE, with the spatial light modulator and/or the DOE being disposed in the beam path of the laser radiation between the solid-state body and the radiation source.

Arranged in the path of the laser radiation, according to another preferred embodiment of the present invention, before the penetration of the laser radiation into the donor substrate or solid-state body, is a diffractive optical element (DOE). The DOE divides up the laser radiation over a plurality of light paths in order to generate a plurality of focusses. The DOE preferably produces, over a length of 200 µm, an image field curvature which is less than or equal to 50 µm, more particularly less than or equal to 30 µm or less than or equal to 10 µm or less than or equal to 5 µm or less than or equal to 3 µm, with the DOE generating at least 2 and preferably at least or exactly 3 or at least or exactly 4 or at least or exactly 5 or at least or exactly or up to 10 or at least or exactly or up to 20 or at least or exactly or up to 50 or up to 100 focusses at the same time for altering the physical properties of the donor substrate. This embodiment is advantageous because a significant acceleration of the process can be achieved.

In the context of the present invention, therefore, it has been recognized that high powers are divided up with diffractive optical elements (DOEs) over a plurality of foci in the focal plane. DOEs exhibit interference phenomena even before the focal plane; it has been recognized that interferences at the surface may, in front of the focal plane, generate local intensity maxima which can lead to damage to the surface and may result in reduced transmissivity for laser radiation for depth working. It has been recognized, moreover, that some materials (e.g., SiC) have local differences in refractive index and in other physical properties (e.g., absorption, transmission, scattering), as a result, for example, of the doping of material (frequent occurrence: doping spot). It has been recognized, moreover, that, in dependence on the surface roughness of the material at the surface of laser incoupling, the wavefront of the laser in the depth of the material may be significantly impaired, causing the focus to have reduced intensity (lower multiphoton transition probability), which would in turn lead to higher intensities, with problems as stated above.

Irradiating the laser beams onto or into the solid-state body or donor substrate below the Brewster angle is complicated and may be challenging, since the different beam components travel pathways of differing length in the higher-index medium. The focus, accordingly, must be adapted by higher energy and/or by beam shaping. Beam shaping here is accomplished preferably, for example, by way of one or more diffractive optical elements (DOEs), which compensates this difference dependently by way of the laser beam profile. The Brewster angle is relatively large, which with a high numerical aperture imposes requirements on the optics and its dimensions and also working distance. Nevertheless, this solution is advantageous, since reduced reflections at the surface also contribute to reduced surface damage, since the light intensity is coupled into the material more effectively. In the sense of this invention, laser beams can be irradiated at the Brewster angle or substantially at the Brewster angle in all other embodiments disclosed in this specification, as well. With regard to Brewster angle incoupling, reference is hereby made to the document "Optical Properties of Spin-Coated TiO2 Antireflection Films on Textured Single-Crystalline Silicon Substrates" (Hindawi Publishing Corporation International Journal of Photoenergy, Volume 2015, Article ID 147836, 8 pages, http://dx.doi.org/10.1155/2015/147836). This document is incorporated by reference in its entirety to become subject matter of the present patent application. The document stated and incorporated above discloses, in particular, calculations of the ideal irradiation angle for various materials and therefore refractive indices. The energy of the laser or of the laser-applying facility is adapted not so much as a function of the material, but, instead, of the possible transmission under a certain angle. If, therefore, the ideal transmission is 93%, for example, then these losses must be taken into account relative to experiments with perpendicular irradiation and losses in that case, for example of 17%, and the laser power must be adapted accordingly.

An example: 83% transmission perpendicularly relative to 93% at an angle means that, to achieve the same energy at depth, only 89% of the laser power used in the case of perpendicular irradiation is required (0.83/0.93=0.89). In the sense of the invention, therefore, the part of the oblique irradiation preferably serves to reduce light loss caused by surface reflection, and to bring more light into the depth. One possible downstream problem to which this may give rise in certain scenarios is that the focus in the depth may acquire a "skewed" profile, with the consequence that the intensities achieved—the key variable for multiphoton working—are again lower, and hence possibly lower even than in the case of perpendicular irradiation, where all of the beam components travel the same optical pathway in the material. This may then take place preferably by a diffractive optical element or by two or more diffractive elements or by a continuous wedge or two or more continuous wedges—and/or other optical elements—in the beam path, which compensate these additional pathways and/or the influence on the individual beams—especially different spherical aberrations over the beam profile. These DOEs can be calculated numerically using suitable software solutions (e.g., Virtuallab from Lighttrans, Jena) and then fabricated or provided.

The modifications, according to a further preferred embodiment of the present invention, are generated preferably by means of a multiphoton excitation, more particularly a two-photon excitation.

The method according to the present invention may comprise one or more, or all, of the following steps:

Moving the solid-state body relative to a laser-applying facility, successively generating a multiplicity of laser beams by means of the laser-applying facility, for generating in each case at least one modification, where the laser-applying facility is adjusted, in particular continuously, as a function of at least one parameter, more particularly of a multiplicity of parameters, for the purpose of the defined focusing of the laser beams and/or for the purpose of adapting the laser energy.

The LASER beam preferably penetrates into the donor substrate via a planar surface of the donor substrate. The LASER beam is preferably inclined relative to the surface, more particularly planar surface, of the donor substrate or solid-state body in such a way that it penetrates into the donor substrate at an angle unequal to 0° or 180° relative to the longitudinal axis of the donor substrate. Preferably the LASER beam is focused for the purpose of generating the modification in the donor substrate.

According to a further preferred embodiment of the present invention, the laser radiation is generated with pulse lengths of less than 5 ns or less than 2 ns, more particularly of less than 1 ns or of less than 700 ps or of less than 500 ps or of less than 400 ps or of less than 300 ps or of less than 200 ps or of less than 150 ps or of less than 100 ps or of less than 50 ps or of less than 10 ps.

Alterations of the physical property, or modifications, are generated preferably in each case with laser pulses which are shorter than 5 ns, more particularly shorter than 2 ns or 1 ns. With particular preference the temporal duration of the individual laser pulses is between 50 ps and 4000 ps or between 50 ps and 2000 ps or between 50 ps and 1000 ps, more particularly between 50 ps and 900 ps or between 50 ps and 700 ps or between 50 ps and 500 ps or between 50 ps and 300 ps or between 300 ps and 900 ps or between 500 ps and 900 ps or between 700 ps and 900 ps or between 300 ps and 500 ps or between 500 ps and 700 ps or between 300 ps and 700 ps or shorter than 900 ps or shorter than 700 ps or shorter than 500 ps or shorter than 300 ps or shorter than 100 ps or shorter than 50 ps.

The laser radiation, according to a further preferred embodiment of the present invention, is generated with pulse energies, where the pulse energies are between 100 nJ and 1 mJ or 500 nJ and 100 µJ or 1 µJ and 50 µJ. The pulse energy per individual shot is preferably 0.1-50 µJ after the objective or after the last optical preparation means and before the penetration of the laser beam into the solid-state body. Where, for example, a DOE was intended to generate a plurality of focuses, the laser radiation assigned to each individual focus, after the objective or after the last optical preparation means and before the penetration of the laser radiation into the solid-state body, has a pulse energy of 0.1-50 µJ.

According to a further preferred embodiment of the present invention, for the purpose of defined thermal conditioning and/or for generating the modification and/or for altering, more particularly for locally altering, a physical property of the donor substrate, the LASER radiation is introduced into the solid-state body with a pulse density of between 0.1 nJ/µm$^2$ and 10 000 nJ/µm$^2$, preferably between 1 nJ/µm$^2$ and 1000 nJ/µm$^2$, and more preferably between 3 nJ/µm$^2$ and 200 nJ/µm$^2$.

According to a further preferred embodiment of the present invention, initiating modifications for initiating subcritical cracks are generated, where at least one process parameter for generating the initiating modifications is different from at least one process parameter for generating the basic modifications; preferably, two or more process parameters are different from one another. Additionally or alternatively, the initiating modifications may be generated in a direction which is at a distance from or inclined relative to the running direction of the line along which the basic modifications are generated.

The subcritical cracks, generated in particular by initiating modifications and/or by modifications which define the detachment range or the detachment plane, and/or by modifications which form a linear architecture, propagate in accordance with the invention preferably less than 5 mm, more particularly less than 3 mm or less than 1 mm or less than 0.5 mm or less than 0.25 mm or less than 0.1 mm. An inclined orientation here may correspond, for example, to an angle of between 0° and 90°, preferably an angle of between 85° and 90°, and more preferably an angle of 90°.

This is a threshold process, triggered when a critical intensity (i.e. power/area) is exceeded. In other words, short pulses require less energy/pulse; higher numerical aperture concentrates the energy to a smaller point, therefore also requiring lower energy to achieve the threshold intensity.

The method of the invention preferably likewise comprises one or more of the following steps: providing the donor substrate and/or providing a donor substrate (or solid-state body) which comprises crystal lattice planes that are inclined relative to a planar major surface. The major surface of the donor substrate here preferably has one boundary in the longitudinal direction of the donor substrate, where a crystal lattice plane normal is inclined in a first direction relative to a major-surface normal. Providing at least one laser. Introducing laser radiation of the laser into the interior of the solid-state body, preferably by way of the major surface, to alter the physical properties of the solid-state body in the region of at least one laser focus. The laser focus is formed preferably by laser beams emitted by the laser. Altering the physical property forms a linear architecture through alteration of the site of penetration of the laser radiation into the donor substrate. The alterations in the physical property are generated preferably on a generation plane, which preferably extends parallel to the major surface. The linear architecture preferably extends in a straight or curved line, at least in sections. The crystal lattice planes of the donor substrate are preferably oriented with an inclination relative to the generation plane. The linear architecture, more particularly at least the section extending in a straight line or the section extending in a curved line, is inclined relative to an intersecting line which arises at the intersection between the generation plane and the crystal lattice plane, and consequently the altered physical property causes cracking of the donor substrate in the form of subcritical cracks. The step of separating the solid-state layer is preferably accomplished by introducing an external force into the donor substrate in order to connect the subcritical cracks, or as much material on the generation plane is altered by means of the laser radiation as is required to detach the solid-state layer from the donor substrate, with connection of the subcritical cracks. The major surface is regarded/defined here preferably as a surface of ideal planarity.

This method is advantageous because crack growth is confined perpendicularly to the writing direction, owing to the fact that the linear architecture is inclined relative to an intersecting line that arises at the intersection between the generation plane and the crystal lattice plane. The modifications per writing line are therefore not generated in the same crystal lattice planes. Consequently, for example, the first 1-5% of the modifications per writing line may intersect only a fraction, more particularly less than 75% or less than 50% or less than 25% or less than 10%, or no, crystal lattice planes, and the last 1-5% of the modifications may intersect the same writing line. The writing line here is preferably longer than 1 cm or longer than 10 cm or longer than 20 cm or up to 20 cm long or up to 30 cm long or up to 40 cm long or up to 50 cm long. Per writing line, therefore, significantly fewer modifications are generated in the same crystal lattice planes, thereby limiting crack propagation along these crystal lattice planes. Inclined should be understood here as nonparallel or nonsuperimposing, and may therefore be present, for example, from an angle of just 0.05°; even at very small angles, in particular below 1°, crystal lattice planes different from one another over the length of extent of the linear architecture, more particularly slip planes, are locally cut or modified or altered by the modification or modifications.

This leads to a key second advantage of the present invention, namely that the writing direction need not necessarily be implemented in such a way that the further cracks generated are required to be superimposed on the latterly generated cracks. It is now also possible for the writing direction to be the opposite. Because of the possible shortness of the cracks as a result of the method of the invention, indeed, there is no shading by the cracks accomplished latterly. This makes it possible, in spite of the opposed writing direction, to realize, for example, linear spacings of less than 100 µm, more particularly of less than 75 µm or of less than 50 µm or of less than 30 µm or of less than 20 µm or of less than 10 µm or of less than 5 µm or of less than 2 µm.

Alteration in the physical property may be understood here preferably to refer to the generation of a materials modification or the generation of a crystal lattice defect, more particularly the production of a locally limited phase change.

According to a first preferred embodiment of the present invention, the linear architecture or writing line is inclined relative to the intersecting line in an angle range between 0.05° and 87°, more particularly in an angle range between 3° or 5° and 60° and preferably between 10° and 50°, more particularly between 10° and 30°, such as, for example, between 12° and 20° or between 13° and 15°, or between 20° and 50°, more particularly between 25° and 40° or between 30° and 45° or between 28° and 35°. This solution is advantageous since the inclination is such that a sufficiently large number of different crystal lattice planes are a constituent of each further modification of the same linear architecture or writing line.

According to a further preferred embodiment of the present invention, the amount of material of the donor substrate that is altered, forming a linear architecture or two or more linear architectures, is such that the ends of the individual crystal lattice planes, exposed as a result of the separation of solid-state layers, and the materials alterations produce moiré patterns; for this purpose, a multiplicity of materials alteration regions are generated that extend linearly, and preferably in a straight line, and that are oriented parallel to one another.

A linear architecture is regarded here preferably as an amount of points that forms a straight or curved line. The distances between the centers of the individual points are preferably less than 250 µm, more particularly less than 150 µm or less than 50 µm or less than 15 µm or less than 10 µm or less than 5 µm or less than 2 µm, from one another.

Preferably a plurality of linear architectures are generated on the same generation plane; preferably, at least two or more of the linear architectures are arranged at the same distance from one another. The linear architectures may preferably have the form of arcs, more particularly circular arcs, or of straight lines.

According to a further preferred embodiment of the present invention, the method of the invention may comprise the step of moving the solid-state body relative to the laser, with the laser being set for defined focusing of the laser radiation and/or for adaptation of the laser energy, preferably continuously, in dependence on at least one parameter and preferably on a multiplicity of parameters, more particularly at least two parameters, with one parameter preferably being the degree of doping of the solid-state body at a predetermined site or in a predetermined region, especially in the interior, of the solid-state body, more particularly at a distance from the solid-state body surface.

According to a further preferred embodiment, an additional or alternative parameter is the degree of doping of the solid-state material that is determined preferably by the analysis of backscattered light (preferably Raman scattering), where the backscattered light has a different wavelength or a different wavelength range from light irradiated in a defined way in order to trigger the backscattering; a Raman instrument is preferably a constituent of the apparatus, and the degree of doping is determined preferably by means of the Raman instrument; one or more or all of these parameters are captured, in particular simultaneously, preferably by means of a common detection head. Raman spectroscopy is preferably likewise employed in the case of glasses, sapphire, aluminum oxide ceramic. The Raman method is advantageous since it measures in the depth of the material, but only from one side, does not require high transmission, and, by means of a fit to the Raman spectrum, yields the charge carrier density/doping, which can be correlated with the laser parameters.

An additional or alternative parameter, according to another preferred embodiment of the present invention, is the degree of doping of the solid-state body at a predetermined site or in a predetermined region, in particular in the interior, of the solid-state body, more particularly at a distance from the solid-state body surface. The degree of doping is preferably linked with site information in such a way that a treatment card is produced or site-resolved treatment instructions are provided, which site-dependently mandates or mandate the laser parameters, especially laser focus and/or laser energy, and/or other machine parameters, more particularly the speed of advance.

The degree of doping, according to a further preferred embodiment of the present invention, is determined by the analysis of backscattered light with an inelastic scattering (Raman scattering), where the backscattered light has a different wavelength or a different wavelength range from light irradiated in a defined way in order to trigger the backscattering, with the backscattered light being backscattered from the predefined location or from the predetermined region.

This embodiment is advantageous because in the laser process, particularly on SiC (though also other materials), the operation must take place in a manner adapted to the site (e.g., different laser energy, etc.). In accordance with the invention it has been recognized that in the case of SiC, for example, the doping is particularly critical for this, since it changes the transparency of the material to the working wavelength and necessitates higher laser energies.

According to a further preferred embodiment of the present invention, the degree of doping is determined by means of an ellipsometric measurement (e.g., Muller matrix ellipsometry with back-side reflection). The ellipsometric measurement is based preferably on an optical transmission of the material.

According to another preferred embodiment of the present invention, the degree of doping is determined by means of a purely optically calibrated transmission measurement, the calibration being effected by means of Hall measurement and 4-point measurement. This method is likewise able to ascertain the doping/number of free charge carriers in the material, which then allows a determination of the laser energy required for the operation.

The degree of doping, according to a further preferred embodiment of the present invention, is determined by means of an eddy current measurement, with determination and evaluation, preferably, of conductivity differences in the solid-state material.

With eddy current measurements or when using eddy current sensors or in the eddy current measuring technique, preference is given to utilizing a transmitting and receiving coil in order to detect local conductivity differences. In the emitting coil, a radiofrequency, electromagnetic, primary alternating field is generated. In the conductive material, eddy currents (currents with local flow) are then induced, which give rise in turn to a secondary electromagnetic alternating field with opposite direction. The superimposition of these fields can be measured, separated and evaluated. Hence it is possible to measure various quality features (layer thickness, layer resistance, homogeneity of material) principally of thin conductive layers, though also of bulk material. In transmission arrangement (test body between emitting coil and receiving coil), optimum resolutions are achieved; however, the arrangement of both coils on one side of the sample, for reflection measurements, is also possible. Through adapted design of the coils and selection of frequency it is possible to utilize different depths of penetration and sensitivities.

In principle, therefore, there are a host of measurement methods which allow the doping to be measured, in principle. Important here is a rapid, contactless, nondestructive method.

A first parameter here may be the mean refractive index of the material of the donor substrate, or the refractive index of the material of the donor substrate in the region of the donor substrate through which laser radiation must pass in order to generate a defined alteration of material, and a second or alternative first parameter here may be the depth of working in the region of the donor substrate through which laser radiation must pass in order to generate a defined alteration of material. The first parameter is determined preferably by means of a refractive index determination means, more particularly by means of spectral reflection, and/or the second parameter is determined preferably by means of a topography determination means, more particularly by means of a confocal-chromatic distance sensor.

According to a further preferred embodiment of the present invention, a first parameter is the mean refractive index of the material of the solid-state body, or is the refractive index of the material of the solid-state body in the region of the solid-state body through which laser beams must pass in order to generate a defined modification, or is the transmission of the solid-state body at defined sites of the solid-state body, and preferably for a defined solid-state body depth. A second or alternative first parameter, according to a further preferred embodiment of the present invention, is the working depth in the region of the solid-state body through which laser beams must pass in order to generate a defined modification. The first parameter, according to one further preferred embodiment of the present invention, is determined by means of a refractive index determination means, more particularly by means of spectral reflection, and/or the second parameter is determined by means of a topography determination means, more particularly by means of a confocal-chromatic distance sensor.

According to a further preferred embodiment of the present invention, a first parameter is the advance direction in which a linear architecture is formed as a sequence of modifications in the generation plane, more particularly an outward and/or return journey. Accordingly, a first parameter may represent the laser parameters in the case of an outward journey, and a second parameter may represent the laser parameters in the case of a return journey, especially in the case of meanderlike working by means of an X-Y table.

Data on the parameters, particularly on the first parameter and on the second parameter, are provided, according to a further preferred embodiment of the present invention, in a data storage facility, and are supplied, at least before the generation of the alteration in material, to a control facility, where the control facility adjusts the laser in dependence on the respective site of the material alteration to be generated; the control facility, for adjusting the laser, preferably likewise processes distance data relating to a distance parameter, where the distance parameter reproduces the distance of the respective location at which laser radiation for generating the alteration in material is introduced into the donor substrate at the time of the alteration of material, relative to the laser, the distance data being captured by means of a sensor facility.

Data on the parameters, particularly on the first parameter and on the second parameter, are provided, according to a further preferred embodiment of the present invention, in a data storage facility, and are supplied, at least before the generation of the modifications, to a control facility, where the control facility adjusts the laser-applying facility in dependence on the particular site of the modification to be generated.

The object stated above is likewise achieved by a method for separating at least one solid-state slice from a donor substrate. This method preferably comprises at least one of the preceding methods for generating microcracks in a donor substrate, and at least the following step:

Generating as many modifications in the same plane as are required to cause the cracks generated by the modifications to detach the solid-state slice from the donor substrate, or introducing an external force into the donor substrate to connect the cracks. This solution is advantageous because a According to a further preferred embodiment of the present invention, to initiate the external force, an acceptor layer is arranged on an exposed surface of the donor substrate, more particularly on the solid-state layer to be separated, where the acceptor layer comprises a polymer material, more particularly PDMS, and the acceptor layer is exposed thermally to generate, more particularly to generate mechanically, stresses in the solid-state body, where the thermal exposure represents a cooling of the acceptor layer to a temperature below the ambient temperature, more particularly to a temperature below 0° or to a temperature below −10° or to a temperature between −20° and −200° C., where the cooling takes place such that the polymer material of the acceptor layer fulfils a glass transition and where, as a result of the stresses, the main crack in the solid-state body propagates along the detachment region, more particularly so as to connect the cracks, more particularly subcritical cracks, that are generated by the modification lines.

Additionally or alternatively, the solid-state body, for the purpose of initiating the external force, may be treated with sound, more particularly ultrasound, and/or, for initiating the external force, the circumferential surface of the solid-state body, especially at the level of the detachment plane, may be treated thermally and/or ablatively.

According to a further preferred embodiment of the present invention, the initiation of the external force takes place at an ambient temperature and/or a core temperature of the donor substrate of less than 10° C., or of less than or equal to 1° C. or of less than or equal to 0° C. or of less than or equal to −1° C. or of less than or equal to −10° C. or of less than or equal to −50° C. or of less than or equal to −100° C. or of less than or equal to −125° C. or of less than or equal to −150° C. or of less than or equal to −175° C. This solution is advantageous because the lattice planes slide off better at low temperatures. This is a result preferably of the fact that there are fewer disruptions to sliding from movements in the crystal.

According to a further preferred embodiment of the present invention, the mean propagation velocity of the main crack in a radial direction of the donor substrate is less than 5 cm/second or less than 3 cm/second or less than 1 cm/second, more particularly less than 0.5 cm/second and preferably less than 0.1 cm/second. The mean propagation velocity of the main crack in a radial direction of the donor substrate is preferably between 0.5 cm/second and 0.1 cm/second, more particularly between 0.4 cm/second and 0.15 cm/second or between 0.35 cm/second and 0.2 cm/second. This embodiment is advantageous because a slow crack propagation velocity allows very precise crack guidance to be brought about.

Starting from a trigger site, the crack initially propagates more rapidly in the circumferential direction of the donor substrate than in a radial direction of the donor substrate. Preferably the crack or the main crack propagates completely in the circumferential direction, and up to complete propagation in the circumferential direction the crack propagates, in particular on average or at maximum, less than 5 cm, more particularly less than 3 cm or less than 2 cm or less than 1 cm or less than 0.5 cm or less than 0.2 mm, in a radial direction of the donor substrate.

The article "Large Area 4H SiC Products for power Electronic Devices", Material Science Forum, ISSN: 1662-9752, Vol. 858, pp 11-14 and the article "Exploration of Bulk and Epitaxy Defects in 4H-SiC Using Large Scale Optical Characterization", Material Science Forum, ISSN: 1662-9752, Vol. 897, pp 226-229 are incorporated by reference in their entirety to become part of the subject matter of the present invention.

The use of the word "substantially", preferably in all cases where this word is used in the context of the present invention, defines a deviation in the range of 1%-30%, more particularly of 1%-20%, more particularly of 1%-10%, more particularly of 1%-5%, more particularly of 1%-2%, from the stipulation which would be the case without the use of this word.

BRIEF DESCRIPTION OF THE DRAWINGS

Individual representations or all the representations in the figures described hereinafter are to be regarded preferably as construction drawings, meaning that the dimensions, proportions, functional relationships and/or arrangements that are apparent from the figures correspond preferably exactly or preferably substantially to those of the apparatus of the invention or of the product of the invention. Further advantages, aims and properties of the present invention are elucidated with reference to the description which follows of appended drawings, in which apparatuses of the invention are represented by way of example. Elements of the apparatuses and methods of the invention that in the figures coincide at least substantially in terms of their function may be identified here by identical reference symbols, there being no need for these components or elements to be numbered or elucidated in all the figures. The invention is described below purely by way of example using the appended figures.

In the figures:

FIG. 1a shows a first schematic representation of the relation between writing line and polarized laser radiation;

FIG. 1b shows a second schematic representation of the relation between writing line and polarized laser radiation;

FIG. 2a-2e show different exemplary representations of different polarizations,

FIG. 3a shows a third schematic representation of the relation between writing line and polarized laser radiation;

FIG. 3b shows a fourth schematic representation of the relation between writing line and polarized laser radiation;

FIGS. 9a, 9b, and 10a show the alteration in the inclination of the linear architecture relative to the ends of the crystal plane when the donor substrate is conveyed beneath a laser facility, by means of a rotation facility;

FIG. 10b shows a plan view of an exemplary rotation facility;

FIG. 10c shows a side view of a working unit, where the working unit has a laser element which can preferably be moved linearly, and has a rotation facility with a multiplicity of donor substrates arranged thereon;

FIG. 13 shows a further schematic representation of a generation of mechanical stresses in the interior of the solid-state body for the purpose of delimiting the propagation of the subcritical cracks;

FIG. 14a-14c show optical means for altering the laser beam properties; and

FIG. 15 shows a generation plane or modification plane which has regions with different modification concentrations.

DETAILED DESCRIPTION

Figure 4:
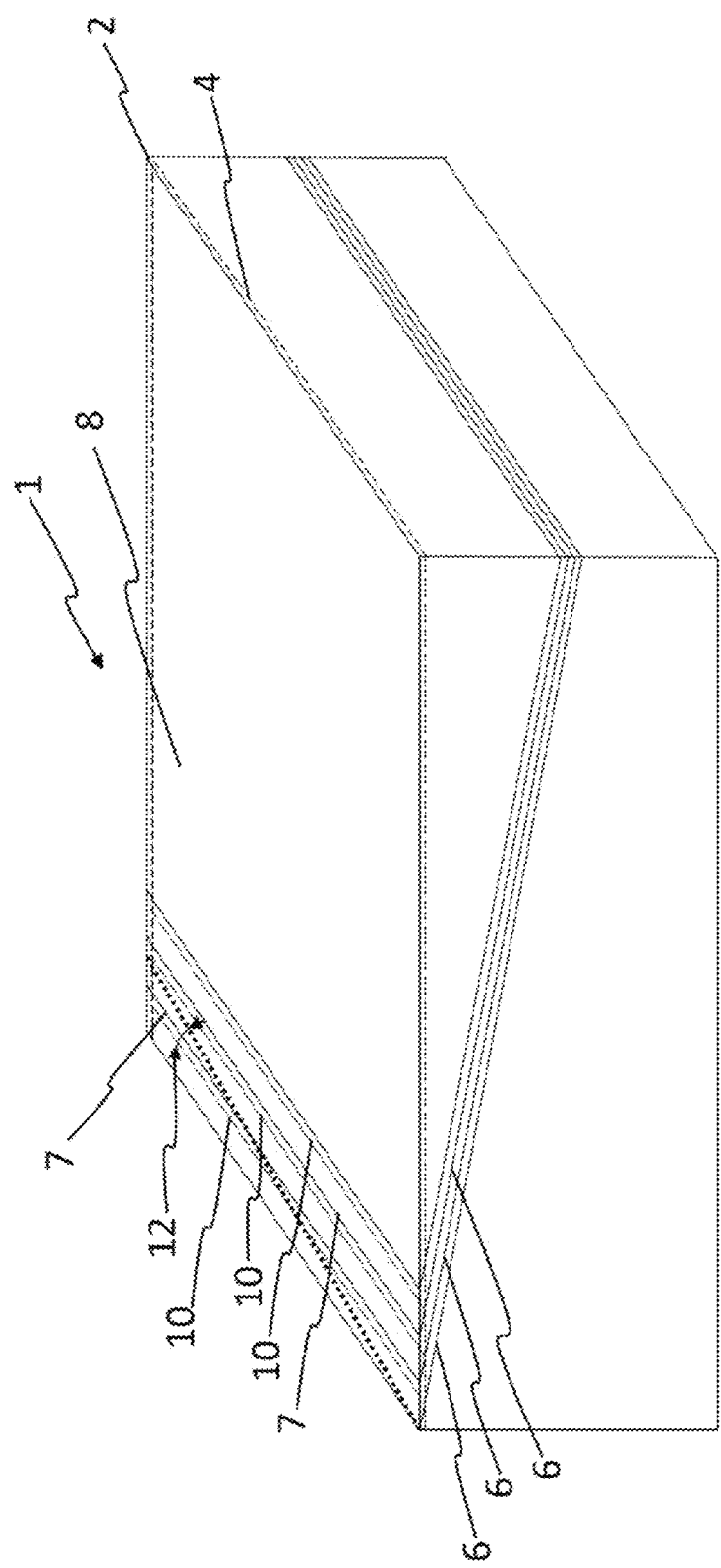
FIG. 4 shows a donor substrate having crystal lattice planes, oriented relative to the longitudinal axis at an angle of unequal to 90°, and laser writing lines generated.

FIG. 1a shows a schematic representation of a solid-state body 1 during a treatment, more particularly the generation of modifications 9 in the interior of the solid-state body 1. These modifications 9 represent phase transformations of the solid-state material, more particularly SiC, that are generated by means of multiphoton excitation, preferably. According to this representation, the modifications 9 are generated in such a way that they are at a distance from one another. This solution is advantageous since, as a result, a modification 9 already generated does not, or not to a substantial extent, alter or influence the absorption of the laser beams. The modifications 9 are generated preferably in the form of linear architectures or writing lines 103. The writing lines 103 here are preferably of straight-line form. According to this representation, the writing lines 103 are oriented preferably parallel to the intersecting line 10. This intersecting line 10 is a result preferably of an intersection between the generation plane 4 and the crystal lattice plane 6 (cf. FIG. 4). It can be seen according to this representation, moreover, that the modifications 9 are always oriented in the same direction. This is a result of the defined polarization of the laser radiation. According to FIG. 1a, therefore, a first polarization is used, whereas according to FIG. 1b a different polarization is used. The different polarizations also preferably result in different damage patterns.

FIGS. 2a to 2e show a number of examples of differently polarized laser radiation. The example of FIG. 2a corresponds to the example from FIG. 1a, and the example from FIG. 2b corresponds to the example from FIG. 1b.

Furthermore, the polarization for two or more or all of the writing lines 103 can be adjusted to form a defined angle relative to the longitudinal extent direction of the writing line 103. The angle in this case may be preferably between 0° and 90°, more particularly between 5° and 85°, more particularly between 15° and 75°, more particularly between 30° and 60°, more particularly between 40° and 50°, or may be 45° or substantially 45°. This is shown, for example, by FIGS. 2c to 2e.

FIG. 2d shows that the modifications 9 of different writing lines 103 may have different orientations. It is likewise possible that the modifications 9 of one writing line may be polarized with different definition pointwise or in sections.

FIG. 2e shows a variant whereby more than 2, more particularly 3 or more than 3, different polarized writing lines 103 are generated.

It is likewise conceivable for the orientation R of individual or two or more modifications or of the majority of the modifications of a linear architecture to deviate from one another. Particularly in the case of curved or spiral linear architectures, the orientation R of the modifications may differ from one another. The orientation R of the modifications may therefore change, for example, continuously or gradually or in blocks, with a block consisting preferably of 2 or more, more particularly 2-200 or 2 to 100 or 2 to 50, modifications.

FIG. 3a shows that the writing lines may be inclined relative to the intersecting lines 10. Depending on the orientation of the polarization relative to the writing direction, the modifications 9 thus generated may have an inclined orientation relative to the intersecting line 10. FIG. 3b shows that the modifications may be generated in a 90° orientation to the intersecting line 10, whereas the writing line is inclined, or rotated in the plane, relative to the intersecting line 10.

FIG. 4 shows schematically that laser radiation 14 (cf. FIG. 10c) of a laser is introduced via a major surface 8 into the interior of the solid-state body 1 for the purpose of altering the physical properties of the solid-state body 1 in the region of at least one laser focus, the laser focus being formed by laser beams emitted from the laser. By altering the site of penetration of the laser radiation into the donor substrate 1, the alteration of the physical property forms a linear architecture 103, with the alterations in the physical property being generated on at least one, more particularly the same, generation plane 4. The crystal lattice planes 6 of the donor substrate 1 here are inclined relative to the generation plane 4, more particularly at an angle of between 0.1° and 9°, preferably of 2° or 4° or 8°, in alignment. The linear architecture 103 or writing line here is inclined relative to an intersecting line 10 which arises at the intersection between the generation plane 4 and the crystal lattice plane 6. As a result of the altered physical property, the donor substrate 1 undergoes cracking in the form of subcritical cracks. Not shown here is a step of separation of the solid-state layer 2 by introduction of an external force into the donor substrate 1 for the purpose of connecting the subcritical cracks. Alternatively to this, an amount of material on the generation plane 4 may be altered by means of the laser radiation such that, with connection of the subcritical cracks, the solid-state layer 2 undergoes detachment from the donor substrate 1. The generation plane 4 is preferably parallel to the major surface 8.

Working is carried out in the form of generation of linear architectures 103 or writing lines or lines which are formed by placement of individual laser shots at a defined distance.

Possible specifically, for example, is the production of a silicon carbide wafer, more particularly of the 4H polytype having a 0001 surface, with/without doping, with an off-angle in crystal axis of >0° (industry standard are 4° or 8°—about the direction of a major axis). Since the slip plane of the hexagonal crystal structure runs parallel to the 0001 plane, there is an intersecting line of the 0001 crystal plane with the wafer surface, since the latter is inclined relative to it by the off-angle.

A fundamental consideration of the new method, therefore, is that the working direction of the laser lines 103 deviates from the direction of these intersecting lines. The working direction is also preferably not to extend along one of the main directions of the crystal or along the intersecting lines of the preferred slip plane of the crystal with the surface of the crystal.

Also possible, for example, is the production of a wafer of silicon carbide of polytype 4H. Silicon carbide of polytype 4H has a hexagonal crystal system with a wurtzite structure and a six-fold symmetry in the 0001 plane. Accordingly, a new major axis of the crystal occurs every 60°. If the surface through which the working laser penetrates into the piece of material to be worked is cut along the 0001 plane, then the six-fold symmetry is found again on rotation about the surface normal. A line writing direction is then produced here that is rotated by 30° to the respective major axes and is therefore oriented between two major axes. This ensures that the written line as far as possible crosses the unit cells of the crystal, and it is harder for cracks to form that span substantial regions and relate to a plurality of unit cells at once. Silicon carbide of the 4H polytype is often cut at an off-angle of 4° relative to the 0001 plane, in order to simplify epitaxy steps in the subsequent working. Here it emerges that the projection of the major axes of the crystal to one another is also at virtually 60° to one another, so making 30°+/−3° preferred writing angles for the working of the invention.

A further possibility, for example, is the production of a wafer of cubic SiC (so-called 3C). Cubic SiC behaves like cubic crystal systems, therefore having the 111 plane as preferred slip plane, resulting in a preferred line writing direction of 22.5°+/−3°.

A further possibility, for example, is the production of a wafer of silicon having a 100 surface with/without doping with an off-angle of the crystal axis of 0°.

The preferred slip plane for silicon with its cubic structure (diamond structure) is the 111 plane which intersects the wafer surface at an angle of 45° to the crystal's major axes. This therefore results in a target line writing angle of 22.5°+/−3° to the major axes of the crystal and the intersecting lines of the slip plane with the wafer surface that are oriented at a 45° angle to one another.

Because silicon substrates as well may be cut with an off-angle, it is possible here again for a different working angle to be preferred. In the case of a tilt about a major axis by an angle a, at the surface of the substrate the symmetry is broken from a 4-fold symmetry to a 2-fold symmetry as a result of the tilt. The projected length of the major axis about which tilting does not take place then scales proportionally to cos(a), so leading to a change in the ideal angle between major axes and intersecting line of the slip plane with the surface. The two line writing angles b that are then possible as a result of the breaking of symmetry are then either b1=tan−1(cos a)/2 or b2=tan−1(1/cos a)/2.

For gallium nitride with a hexagonal wurtzite structure, having a 6-fold crystal symmetry in the 0001 plane, the preferred slip plane of which is the 0001 plane, the consequent angle of 60° for the major axes of the crystal produces a preferred line direction at 30°+/−3° to the major axes.

For sapphire or aluminum oxide, with a hexagonal corundum structure having a 6-fold crystal symmetry in the 0001 plane, the consequent angle of 60° for the major axes of the crystal produces a preferred line direction of 30°+/−3° to the major axes for so-called C-plane sapphire.

For A plane-cut sapphire, the major axis orientation is at the 90° angle, with a 180° symmetry, thus producing a preferred line writing angle of 45°+/−3°.

C-plane substrates of sapphire are cut so that the sixfold symmetry is apparent on the surface, and the surface coincides with the slip plane, making the preferred angle 30°+/−30°.

For M plane-cut sapphire, the major axis orientation is at the 90° angle, with a 180° symmetry, thus producing a preferred line writing angle of 45°+/−3°.

R-plane sapphire has no rotation symmetry but has major axis projections at 45° to the projection line of the slip plane, and so here as well the preferred writing direction is 22.5°+/−30°.

For lithium tantalate, with a triclinic structure, which is related to the hexagonal crystal system, the writing direction which results, dependent on the orientation of the substrate, is between 10°+/−3° and 45°+/−3° relative to the individual major axes and their projection into the substrate surface.

For gallium arsenide with a zincblende structure, having a 4-fold crystal symmetry in the 100 plane, the preferred slip plane of which is the 111 plane, the consequent angle of 90° for the major axes of the crystal produces a preferred line direction at 22.5°+/−° to the major axes of the substrate or donor substrate 1 with a 100 surface.

For gallium oxide with a monoclinic, cubic structure, having a 4-fold crystal symmetry in the 100 plane, the preferred slip plane of which is the 111 plane, the consequent angle of 90° for the major axes of the crystal produces a preferred line direction at 22.5°+/−3° to the major axes of the substrate with a 100 surface.

For germanium with a diamond structure, having a 4-fold crystal symmetry in the 100 plane, the preferred slip plane of which is the 111 plane, the consequent angle of 90° for the major axes of the crystal produces a preferred line direction at 22.5°+/−3° to the major axes of the substrate with a 100 surface.

For indium phosphide with a zincblende structure, having a 4-fold crystal symmetry in the 100 plane, the preferred slip plane of which is the 111 plane, the consequent angle of 90° for the major axes of the crystal produces a preferred line direction at 22.5°+/−3° to the major axes of the substrate with a 100 surface.

For yttrium aluminum garnet with a cubic structure, having a 4-fold crystal symmetry in the 100 plane, the preferred slip plane of which is the 111 plane, the consequent angle of 90° for the major axes of the crystal produces a preferred line direction at 22.5°+/−3° to the major axes of the substrate with a 100 surface.

Figure 5:
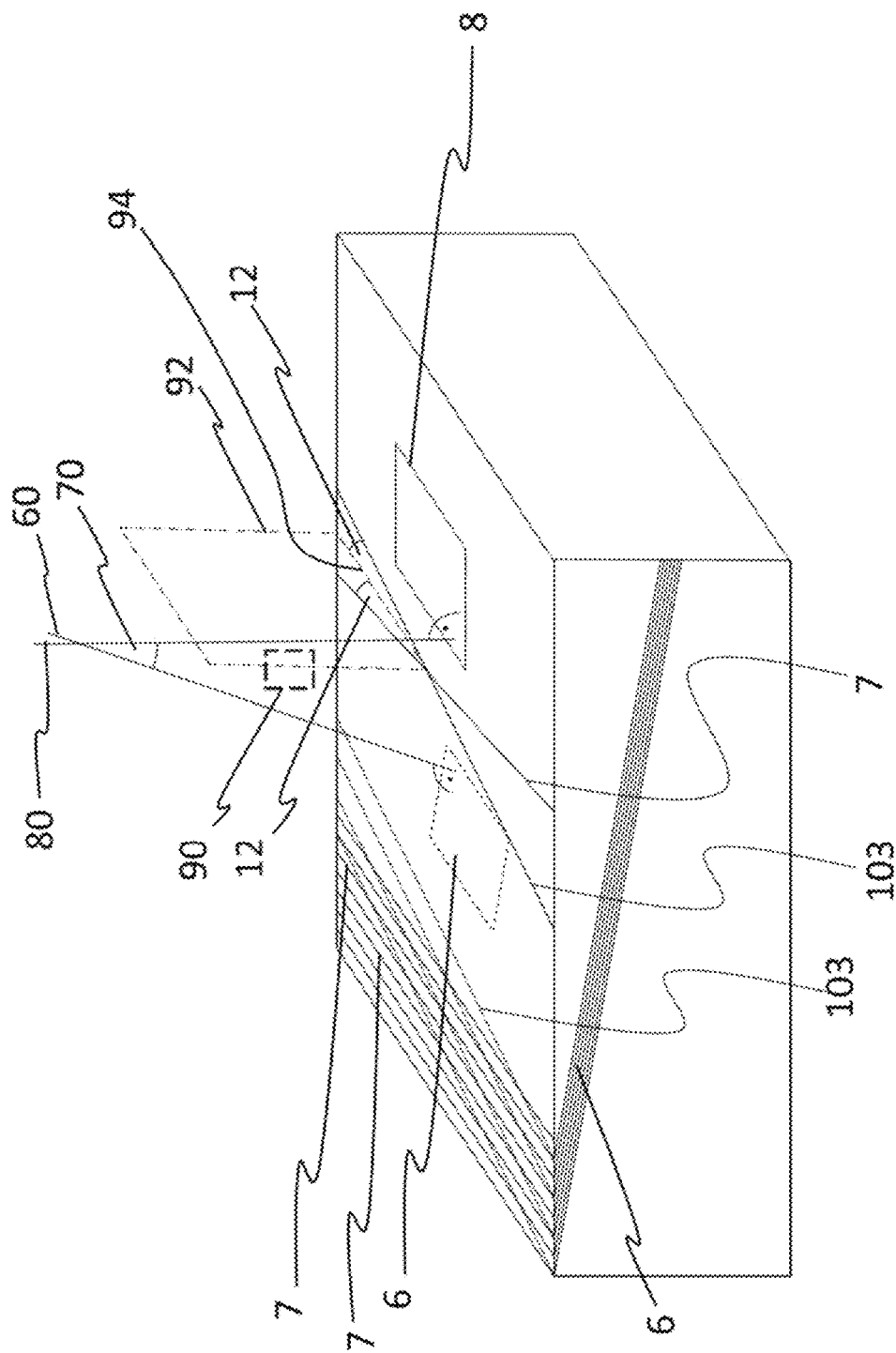
FIG. 5 shows a further donor substrate having crystal lattice planes, oriented relative to the longitudinal axis at an angle of unequal to 90°, and laser writing lines generated, where the orientation of the laser writing lines or linear architecture is defined by means of planes.

FIG. 5 shows a key step in the method of the invention for separating at least one solid-state layer 2 from a donor substrate 1, and a geometric derivation of the orientation of the writing line 103 or of the orientation of the linear architecture.

According to this representation, the method of the invention may also or alternatively comprise the following steps:

Providing the donor substrate 1, the donor substrate 1 having crystal lattice planes 6 which are inclined relative to a planar major surface 8, and the major surface 8 forming one boundary of the donor substrate 1 in the longitudinal direction L of the donor substrate 1, with a crystal lattice plane normal 60 being inclined in a first direction relative to a major-surface normal 80; providing at least one laser 29, introducing laser radiation 14 from the laser into the interior of the solid-state body or donor substrate 1 by way of the major surface 8, to alter the physical properties of the solid-state body in the region of at least one laser focus, the laser focus being formed by laser beams emitted by the laser, the alteration of the physical property forming a linear architecture through alteration of the site of penetration of the laser radiation into the donor substrate 1, the linear architecture preferably extending in a straight line, at least in sections, and the linear architecture, more particularly at least the section that extends in a straight line, being generated parallel to the major surface 8 and extending in a second direction which, relative to the first direction, is inclined at an angle which is other than 90°, and, as a result of the altered physical property, the donor substrate 1 undergoes cracking in the form of subcritical cracks; removing the solid-state layer by introducing an external force into the donor substrate to connect the subcritical cracks, or altering a sufficient amount of material on the generation plane, by means of the laser radiation, to cause the solid-state layer to detach from the donor substrate, with connection of subcritical cracks. The major surface here is preferably part of the solid-state layer 2 that is separated off.

The second direction here is preferably inclined relative to the first direction in an angle range between 45° and 87°, more particularly in an angle range between 70° and 80°, and preferably at 76°.

Figure 6:
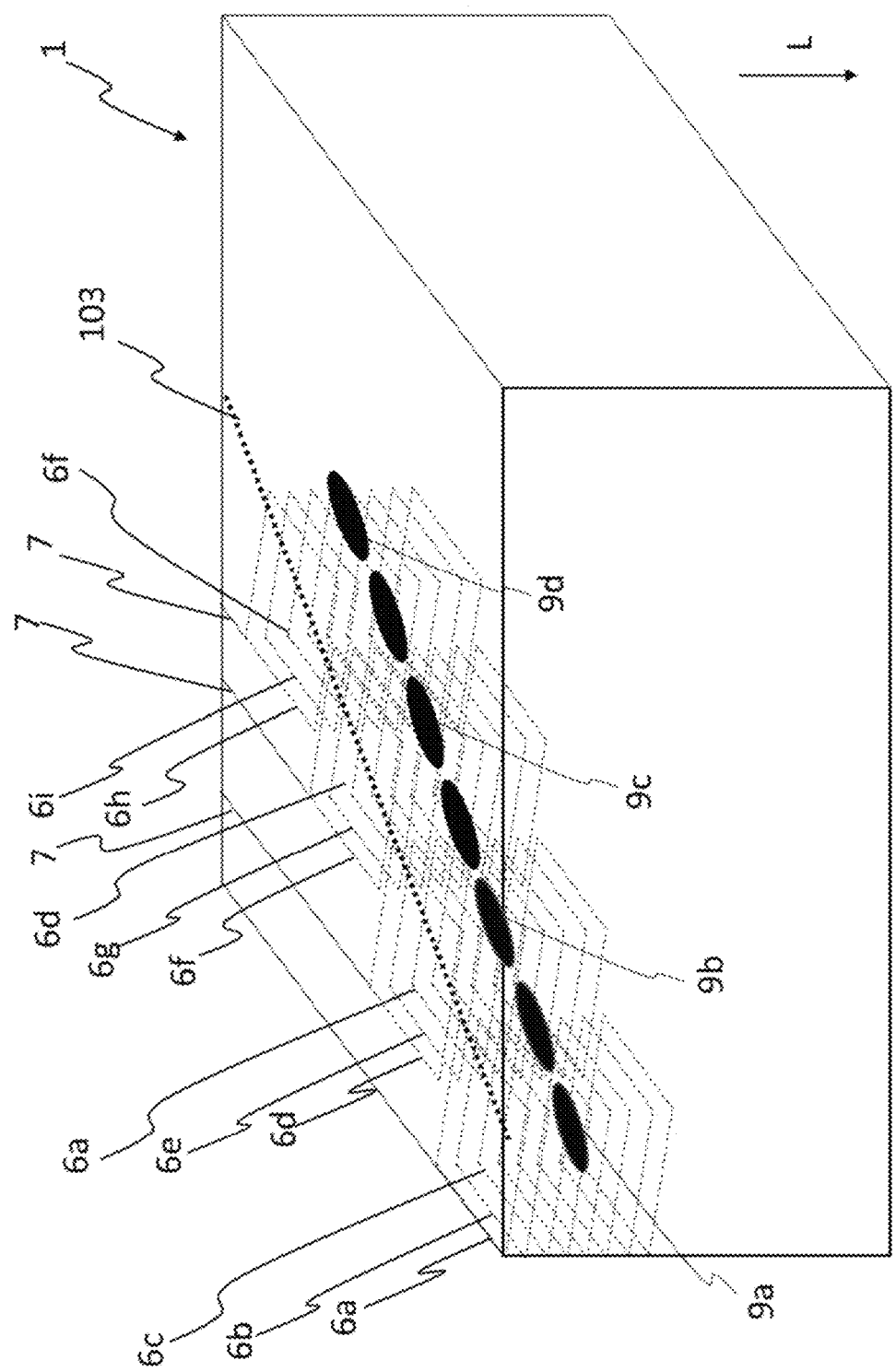
FIG. 6 shows that the modifications of a linear architecture intersect a multiplicity of different crystal lattice planes.

FIG. 6 shows that the linear architecture 103 or the writing line is inclined relative to the ends of the crystal lattice plane or, as shown in FIG. 5, relative to an intersecting line 10 which arises at the intersection between the generation plane 4 and the crystal lattice plane 6. As a result of this orientation, crack propagation is limited in the direction of the crystal lattice planes 6 (especially slip planes). The modifications 9 per writing line are therefore not generated in the same crystal lattice planes 6. For example, the first 1-5% of the modifications per writing line 103 may therefore intersect only a fraction, more particularly less than 75% or less than 50% or less than 25% or less than 10%, or no, crystal lattice planes, while the last 1-5% of the modifications intersect the same writing line 103 in the longitudinal substrate direction L. This relationship is illustrated schematically in particular by the modification 9a intersecting the crystal lattice planes 6a-6c, and the modification 9b intersecting the crystal lattice planes 6a, 6d and 6e. Accordingly, two modifications 9a and 9b intersect different crystal lattice planes, despite being part of the same linear architecture 103 or writing line. It is evident, furthermore, that the modifications 9c and 9d, for example, preferably intersect different crystal lattice planes, more particularly predominantly different or completely different crystal lattice planes, than the modification 9a.

The ends 7 of the crystal lattice planes 6 that end on the major surface 8 preferably form a kind of sawtooth pattern as represented in microscopic section.

The individual crystal lattice planes 6 are inclined preferably at an angle of between 0.1° and 10°, more particularly between 2° and 9°, such as 4° or 8°, for example, relative to the longitudinal axis L. The individual crystal lattice planes of the donor substrate 1 are preferably oriented parallel to one another.

Figure 7:
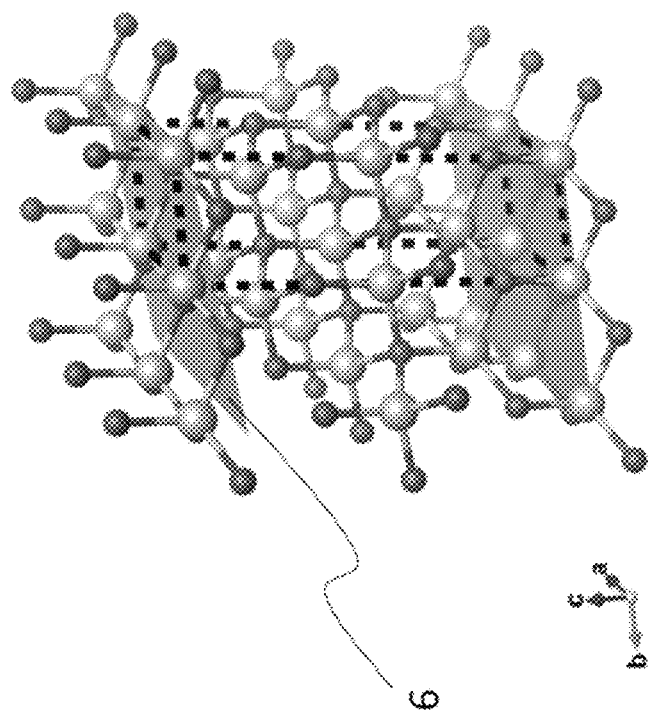
FIG. 7 shows an example of a crystal lattice with slip plane for 4HSiC.
Figure 8C:
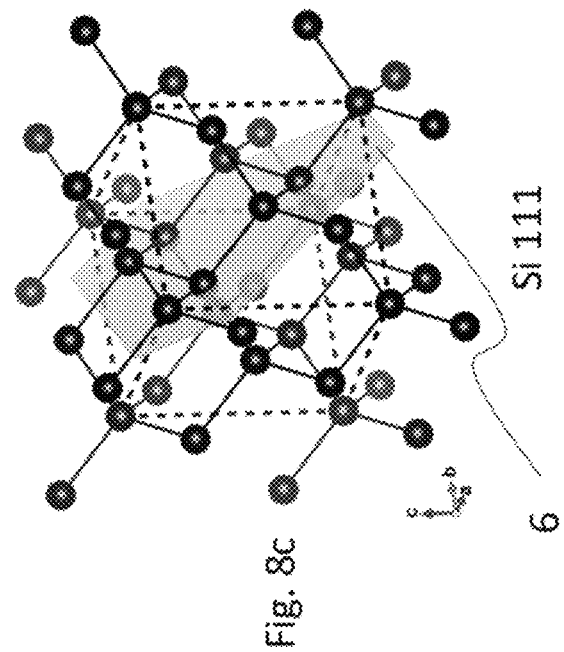
FIG. 8c shows an example of a crystal lattice with slip plane 111 for Si.
Figure 8A:
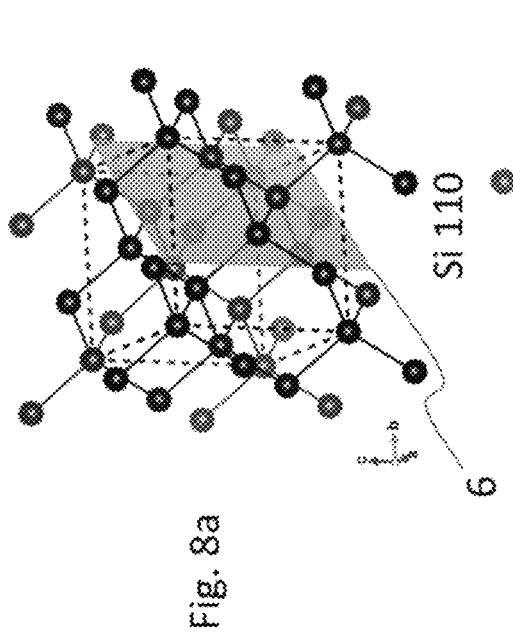
FIG. 8a shows an example of a crystal lattice with slip plane 110 for Si.
Figure 8B:
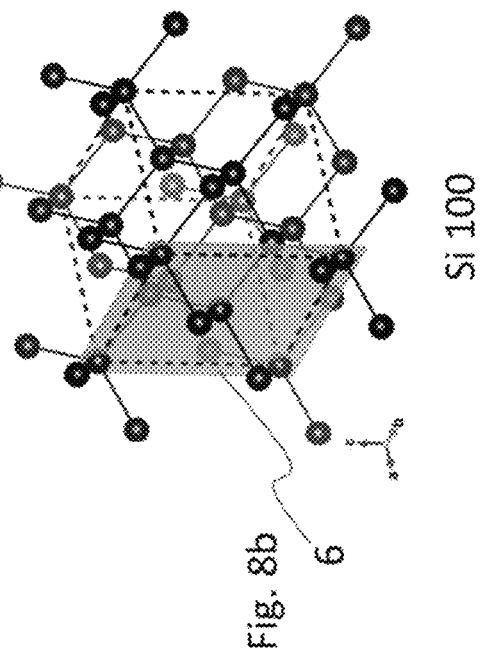
FIG. 8b shows an example of a crystal lattice with slip plane 100 for Si.

FIG. 7 shows an example of a crystal lattice with slip plane for 4HSiC; FIG. 8a shows an example of a crystal lattice with slip plane 110 for Si; FIG. 8b shows an example of a crystal lattice with slip plane 100 for Si; and FIG. 8c shows an example of a crystal lattice with slip plane 111 for Si.

The crystal lattice planes 6 are preferably slip planes of a certain type. If the crystal structure is cubic face centered, then the slip plane is preferably the {111} plane and the slip direction is the <110> direction. If the crystal structure is cubic space centered, then the slip plane is preferably the {110} plane and the slip direction is the <111> direction, or the slip plane is preferably the {112} plane and the slip direction is the <111> direction, or the slip plane is preferably the {123} plane and the slip direction is the <111> direction. If the crystal structure is hexagonal, then the slip plane is preferably the {0001} plane and the slip direction is the <1120> direction, or the slip plane is preferably the {1010} plane and the slip direction is the <1120> direction, or the slip plane is preferably the {1011} plane and the slip direction is the <1120> direction.

FIGS. 9a, 9b, and 10a show schematically the generation of a linear architecture 103 by means of laser or laser facility in a donor substrate 1. The linear architecture 103 in this case is generated in the form of an arc, or curved. In this case there is preferably no change in the laser facility or in the site of the generation of modification. In other words, the site of the generation of modification and the center 50 of rotation of the rotation facility 45 preferably remain in the same orientation to one another. With preference, therefore, there is only a movement of the donor substrate 1 past the laser facility 29 or past an outlet for laser radiation 32. The donor substrate 1 is preferably arranged on the rotation facility in such a way that the line-forming ends 7 of the crystal lattice planes 6 are oriented with an inclination, more particularly at an angle of between 3° and 87° and preferably at an angle of between 10° and 60° or 14° and 45°, relative to a direction 52 which extends orthogonally to the connecting section 51 between the center 50 of rotation of the rotation facility 45 and the center 49 of the donor substrate 1.

From a comprehensive viewing of FIGS. 9a, 9b, and 10a it can be seen that with progressive rotation of the rotation facility 45, the donor substrate 1 is conveyed past the laser facility, and the linear architecture 103 is generated or extended. At the start (FIG. 9a) of the linear architecture, it is generated at an angle e to the intersecting line 10 or to a line which is formed by the end of a crystal lattice plane. In the middle (FIG. 9b) of the linear architecture, it is generated at an angle m to the intersecting line 10 or to a line that is formed by the end of a crystal lattice plane. At the end (FIG. 10a) of the linear architecture, it is generated at an angle s to the intersecting line 10 or to a line which is formed by the end of a crystal lattice plane. The angle e here is preferably greater than the angle m, and the angle m is preferably greater than the angle s. It is likewise conceivable here, however, for the angle s to be larger in amount than the angle m.

The angles are preferably determined such that the centers of two adjacent modifications are conceptually connected to one another, and the angle of the resulting section is determined relative to the intersecting line 10 or relative to a line which is formed by the end 7 of a crystal lattice plane 6.

In accordance with the figures of FIG. 9a-10a, the ideal writing angle in the case of an arrangement of rotating substrates is chosen to be the mean angle between the angle of the tangent on the wafer margin and the tangent in the wafer middle; in other words, for SiC, 30° mean angle may mean for example—depending on the radius of the rotation table and of the substrate—an angle interval between 25° and 35°, thereby maintaining, for example, a preferred writing angle of 30° for hexagonal systems on average.

FIG. 10b shows, purely by way of example, a plan view of a rotation facility 45. Arranged simultaneously on this rotation facility 45 may be a multiplicity, more particularly more than 2 or more than 3 or more than 5 or more than 10, preferably up to 15 or up to 20 or up to 30, donor substrates, more particularly boules or ingots or wafers.

FIG. 10c shows a schematic side view of a system for generating modifications 9 in the interior of a donor substrate 1 or solid-state body. An element 29 of a laser facility, more particularly a laser head, or a beam guide connected to a laser is arranged preferably on a traveling or repositioning facility 30, which is preferably in a spatially fixed arrangement. The traveling or repositioning facility 30 preferably allows the element 29 of the laser facility to be moved, or the laser facility to be moved, in a preferably linear direction, more particularly in a radial direction of the rotation facility 45. Accordingly, after the generation of one or more defined writing lines 103, the element 29 of the laser facility, or the laser facility, is repositioned on preferably two or more, or all, of the donor substrates 1. As a result of the repositioning, the laser beams emitted are introduced into the respective donor substrate 1 at a different site 5 for generation of modification.

Figure 11B:
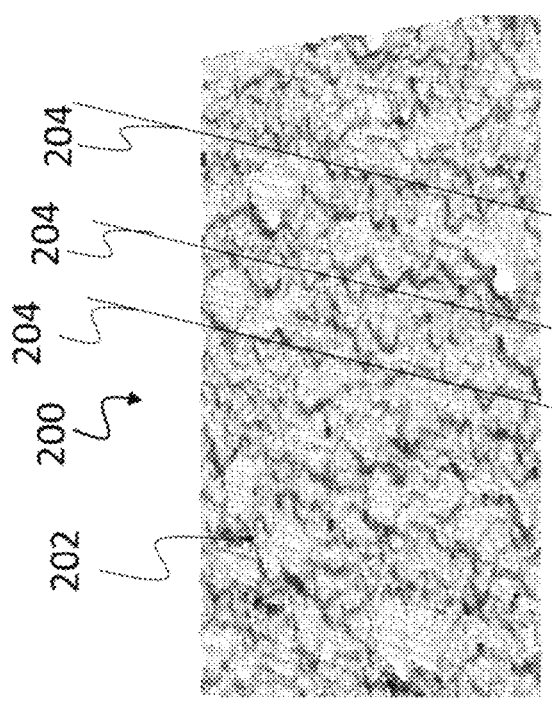
FIG. 11b shows a typical surface structure of a solid-state surface of a solid-state layer separated by the method of the invention.
Figure 11D:
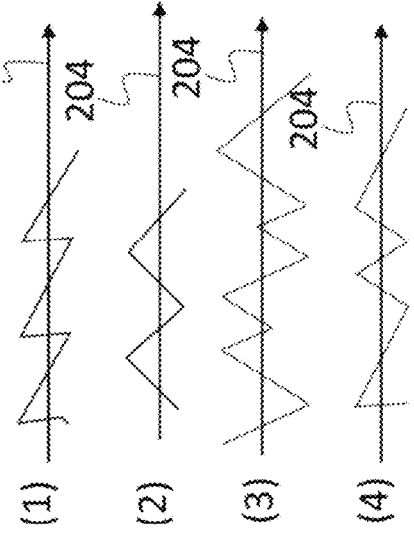
FIG. 11d shows various zigzag lines.
Figure 11A:
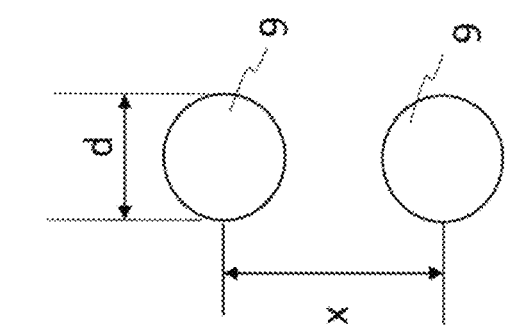
FIG. 11a shows a schematic representation of the theoretical relations of the formula $(d-x)/x$.

FIG. 11a shows the theoretical basis for the condition $(d-x)/d<y$, where y is preferably −0.31 or less than 0.31 or less than 0.35 or less than 0.4. Here, preferably, furthermore, $d=1.22*lambda/NA$−diffraction-limited focal size. x is preferably the distance of the points or the distance of the centers of two focal points generated in succession on a linear architecture. Preferably, furthermore, $x>d$. The numerical aperture used in accordance with the invention is preferably greater than 0.5 or greater than 0.6 or greater than 0.65 or greater than 0.7 or greater than 0.75 or greater than 0.8 or greater than 0.85.

FIG. 11b shows a surface 200, exposed by a separating step, of a solid-state layer separated from a solid-state body. This surface 200 has a topography, and the topography features elongate zigzag elevations. The elongate zigzag elevations extend predominantly, and in each case in their entirety, in a direction 204 or in two or more directions 204, each direction 204 being different from a direction which is parallel to the crystal lattice planes and parallel to the surface, more particularly being inclined thereto at an angle of between 2° and 30°, more particularly between 3° and 15°, more particularly between 4° and 9°. The mean height of the zigzag elevations or the maximum height of the zigzag elevations, especially with respect to the lowermost point on the surface, is preferably less than 100 μm, more particularly less than 75 μm or less than 50 μm or less than 30 μm.

Figure 11C:
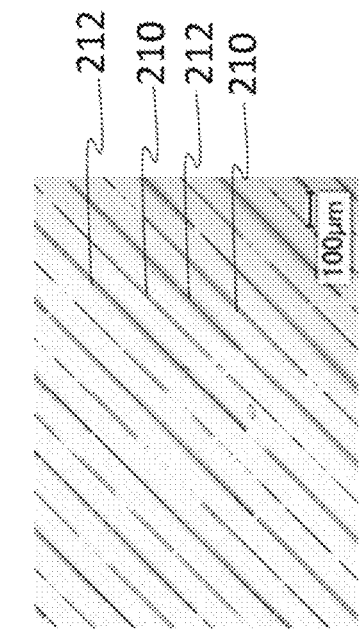
FIG. 11c shows a representation of writing lines generated as a result of differently defined parameters.

Because the laser energy threshold for generating an equal crack pattern or blackening, i.e., phase transformation/laser modification, in the case of a nonzero angle of the written line to the main flat, is dependent on the travel direction, it may be advantageous to adapt the laser energy for the respective direction of working. This is shown in FIG. 11c, where a meandering travel has been carried out for the working, and where every second line 210 (working direction 1) has a different extent of modification from the respectively adjacent lines 212 (working direction 2). Accordingly, the more weakly formed lines would be adapted to a correspondingly higher laser energy, in order to make the damage pattern as uniform as possible and hence to obtain an equal probability of crack formation in each linear travel.

FIG. 11d shows four different zigzag lines (1)-(4). Schematically, these lines dictate examples which may be possessed by the elevations 202 or depressions. The elevations 202 or depressions may repeat uniformly in sections or approximately uniformly. Uniformly repeating zigzag patterns are shown by the patterns (1) and (2). The elevations and depressions here preferably always have a first component which extends in a first direction, and a second component which extends in a second direction. These components preferably repeat along a direction 204, more particularly along the writing direction or along the direction in which the modifications of a linear architecture have been generated. Here, however, it is also possible for the first component to extend for longer or shorter than a mean length "per jag" or in the case of "individual jags". Here, however, it is also possible, additionally or alternatively, for the second component to extend for longer or shorter than a mean length "per jag" or in the case of "individual jags". The first direction may preferably alter per jag in an angle range between 0° and 45°, more particularly in an angle range between 0° and 20° or between 0° and 5°. Preferably, additionally or alternatively, the second direction may alter per jag in an angle range between 0° and 45°, more particularly in an angle range between 0° and 20° or between 0° and 5°. Examples (3) and (4) show crack profiles with variable length components and angles.

Figure 12:
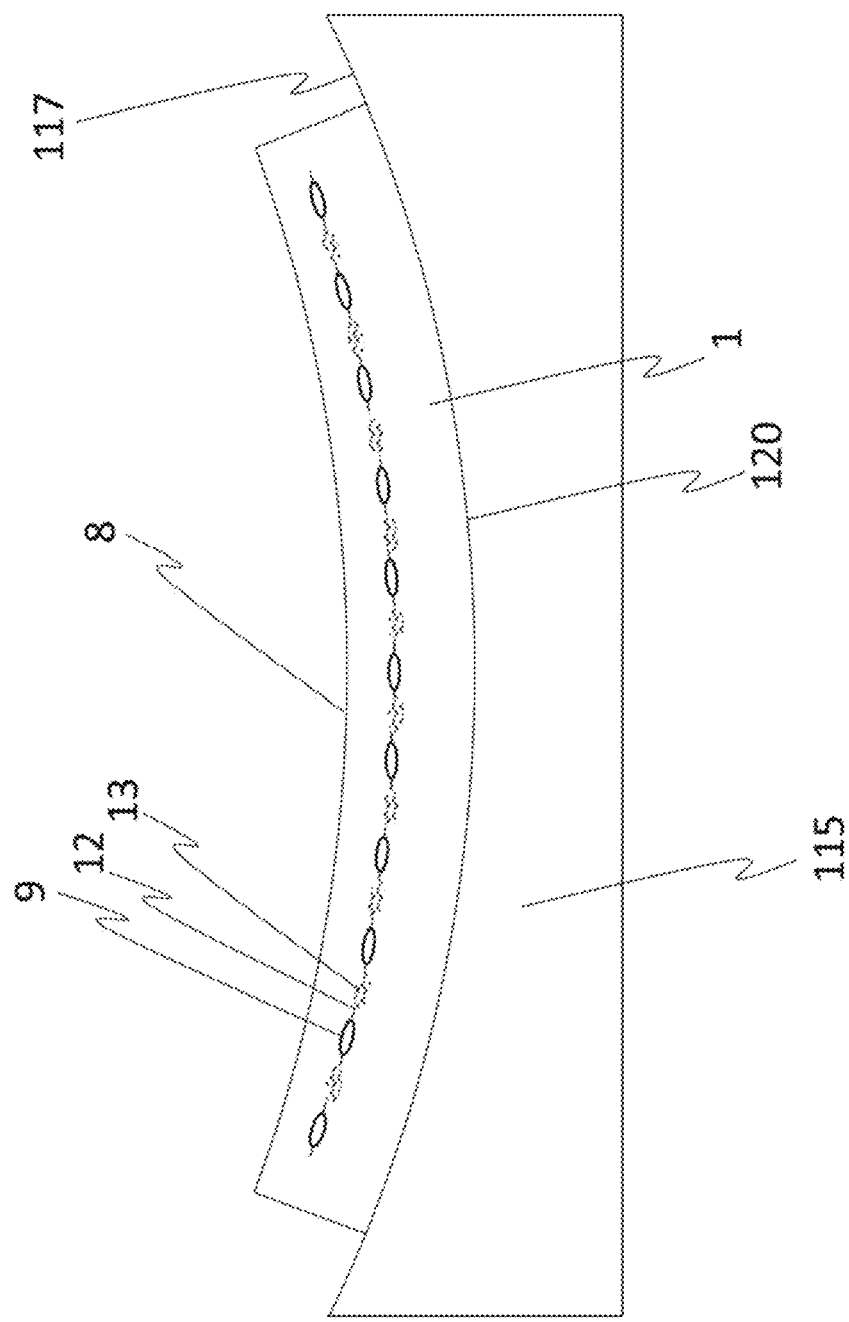
FIG. 12 shows a schematic representation of a generation of mechanical stresses in the interior of the solid-state body for the purpose of delimiting the propagation of the subcritical cracks.

FIG. 12 shows a further preferred embodiment of the present invention. According to this embodiment, the method of the invention for generating modifications 9 in the interior of a solid-state body 1 preferably has at least the features whereby laser radiation 14 of a laser 29 is introduced into the interior of the solid-state body 1 by way of a first surface 8 of the solid-state body 1, where the solid-state body 1 forms a crystal structure and where the laser radiation 14 generates modifications 9 at predetermined locations on a generation plane 4 in the interior of the solid-state body 1. The modifications 9 here are generated preferably at a closer distance to the first surface 8 than to a second surface, with the second surface being formed preferably parallel to the first surface 8. Furthermore, the method of the invention has the feature whereby the modifications 9 generate a plurality of linear architectures 103, more particularly writing lines, with the solid-state body 1 cracking subcritically in the region of the respective modification 9.

The method of the invention, furthermore, may preferably likewise comprise the feature whereby the solid-state body 1 is arranged on a curved surface 117 of a carrier unit 115. As a result of being arranged on the carrier unit 115, the solid-state body 1 is converted into a curved state. The surface 117 is preferably curved in the form of a gutter. The solid-state body is curved preferably predominantly and more preferably completely. The curvature of the surface 117 corresponds preferably to that of a segment of an orbit. This orbit preferably has a radius preferably within a range between: (root of first surface 8 of solid-state body 1)*0.25 and (root of first surface 8 of solid-state body 1)*100, more particularly between (root of first surface 8 of solid-state body 1)*0.5 and (root of first surface 8 of solid-state body 1)*75, more particularly between (root of first surface 8 of solid-state body 1)*1 and (root of first surface 8 of solid-state body 1)*50, more particularly between (root of first surface 8 of solid-state body 1)*2 and (root of first surface 8 of solid-state body 1)*25.

The solid-state body 1 may for example by means of vacuum be coupled on the carrier unit 112; additionally or alternatively, the solid-state body 1 may be bonded to the carrier unit 112.

The curvature produces stresses 13 in the solid-state body that limit the propagation of the subcritical cracks.

Alternatively, however, it is likewise conceivable for the solid-state body 1 to be coupled to a surface of a convex carrier unit. The curvature of the surface in this case corresponds preferably to that of a segment of an orbit. This orbit preferably has a radius preferably within a range between: (root of first surface 8 of solid-state body 1)*0.25 and (root of first surface 8 of solid-state body 1)*100, more particularly between (root of first surface 8 of solid-state body 1)*0.5 and (root of first surface 8 of solid-state body 1)*75, more particularly between (root of first surface 8 of solid-state body 1)*1 and (root of first surface 8 of solid-state body 1)*50, more particularly between (root of first surface 8 of solid-state body 1)*2 and (root of first surface 8 of solid-state body 1)*25.

FIG. 13 shows a further embodiment of the present invention. According to this embodiment, the laser radiation for generating the modifications, before entry into the solid-state body 1, passes through a pressing body 122 which is at least partly transparent for the laser radiation. This pressing body 122 preferably bears against the first surface 8. The solid-state body 1 in this case is preferably coupled to a carrier unit 115, more particularly being bonded and/or fixed by means of vacuum and/or pressed on.

The pressing body preferably has a refractive index which corresponds to the refractive index of the solid-state body. During the generation of modifications, the pressing body generates additional stresses in the solid-state body, and these additional stresses counteract the propagation of the subcritical cracks.

It is possible, furthermore, for the embodiments of FIGS. 12 and 13 to be combined with one another. In that case the pressing body likewise has a curved pressing surface, with the design of the pressing surface corresponding to the curved solid-state body surface with which the pressing surface is brought into contact.

FIG. 14a shows an incident light cone 5700, which generates a focus 5701 in the solid-state body 1. Depicted here is a focus image of an objective traversed by a laser beam with a gaussian profile.

FIG. 14b represents schematically a focus image 5702 of an objective traversed by a laser beam with NON-gaussian profile, the beam, for example, having been altered by an SLM. A spatial light modulator (SLM) is a spatial modulator for light and therefore a device through which a spatial modulation can be applied to light. Relative to the gaussian beam profile, the Z-extent of the focal point is significantly reduced or reducible.

FIG. 14c represents schematically a focus image 5703 of an objective traversed by a laser beam with NON-gaussian profile, the beam, for example, having been altered by a diffractive optical element (DOE). The beam in this case is preferably divided up by the DOE to form a plurality of focuses. A DOE here serves preferably to diffract a laser beam in order to change the spatial imaging of the focal point.

Diffractive optical elements (DOEs) act by diffraction on laser radiation. Structures used here are on the scale of the laser wavelength in their size. By means of numerical simulation of the scattering of light at diffracting structures, an element is calculated, and can then be produced in larger numbers. Generally speaking, the spatial distribution of the light in the laser beam profile is altered, either directly after the element or in the focal point downstream of a focusing element. This means that a beam, for example, can be split into a plurality of beams, that a gaussian beam intensity profile—which is the usual case—is converted into a different form, or that the intensity distribution of the laser radiation in the focus is changed in a way which cannot be achieved by conventional lenses—for example, by the deliberate introduction or suppression of secondary maxima which are needed for the desired laser interaction.

In contrast to this, a spatial light modulator (SLM) is a device for imposing a spatial modulation on light.

An SLM commonly modulates the intensity of a light beam, though it is also possible for the phase, or else the phase and the intensity simultaneously, to be modulated.

This spatial modulation is performed in the case of the DOE by the structures in the element, while in the SLM it is performed by the individual pixels on the SLM. Particularly after imaging or focusing of an intensity-modulated and phase-modulated beam, programmable intensity distributions in the focus can be achieved in this way. Hence, while a DOE acts statically and reproducibly on the laser beam, it is possible by means of an SLM, for example, to carry out dynamic changeover of the number of beams or else the laser beam profile used in a laser working apparatus. Dynamic adaptation in the course of the process is also possible—for example, after feedback from simultaneous monitoring of the progress of the process.

The method hereby proposed features the step, in accordance with the invention, of altering a property of the laser beams before they penetrate the solid-state body, the beam property being the intensity distribution in the focus, where the alteration or adaptation of the beam property is brought about by at least or exactly one spatial light modulator and/or by at least or exactly one DOE, with the spatial light modulator and/or the DOE being arranged in the beam path of the laser radiation between the solid-state body and the radiation source.

For explanation of the functioning of DOEs and spatial light modulators, reference is made to the publication identified hereinafter: Flexible beam shaping system for the next generation of process development in laser micromachining, LANE 2016, 9th International Conference on Photonic Technologies LANE 2016, Tobias Klerks, Stephan Eifel.

Laser beam intensity profiles which deviate from the normally customary gaussian form are referred to as non-gaussian beam profiles and can be used in order to achieve a different outcome of working. Conceivable, for example, is a line focus which, in a dimension perpendicular to the beam propagation direction, has a significantly different extent than in a second dimension. This allows broader regions of the workpiece to be covered by the laser beam in the working step. Also known is a "top-hat" profile, which has a constant intensity in the center of the beam, thus offering the advantage that in working in the focus there are no regions of different intensity, or at least only regions of equal intensity above the laser working threshold. This may be used, for example, in order to minimize the abrasion losses after separation.

The present invention therefore relates preferably to a method for generating modifications 9 in the interior of a solid-state body 1. The method preferably comprises the step of introducing laser radiation 14 from a laser 29 by way of a first surface 8 of the solid-state body 1 into the interior of the solid-state body 1. The surface 8 by way of which the laser radiation 14 penetrates into the solid-state body 1 is preferably part of the solid-state layer to be separated off. The solid-state layer to be separated off is preferably thinner than the remaining, residual fraction of the solid-state body.

The solid-state body 1 preferably forms a crystal structure, and the laser radiation 14 generates modifications 9 at predetermined locations on a generation plane 4 in the interior of the solid-state body 1. This generation plane is preferably parallel to the first surface 8. The modifications 9 are preferably at a closer distance to the first surface 8 than to a second surface, with the second surface being formed preferably parallel to the first surface 8. The modifications 9 generate a plurality of line-shaped architectures 103, more particularly writing lines with points or continuous writing lines, with the solid-state body 1 undergoing subcritical cracking in the region of the respective modification 9, and the subcritical cracks, orthogonally to the longitudinal extent direction of the respective line-shaped architecture, having a crack length or mean crack length of less than 150 μm, more particularly of less than 120 μm or less than 110 μm or less than 90 μm or less than 75 μm or less than 60 μm.

The modifications 9 which belong to the same line-shaped architecture 103 and are generated in succession are preferably generated at a distance from one another which is defined by the function (d−x)/d<−0.31, more particularly <−0.4.

Additionally or alternatively, the laser radiation may have defined polarization. The direction of polarization of the laser radiation 14 in this case is oriented preferably at a defined angle or in a defined angle range relative to the crystal axis of the solid-state body 1, or the longitudinal extent direction R of the modifications 9 generated in the interior of the solid-state body 1 by means of the laser beams 14 is oriented at a defined angle or in a defined angle range relative to an intersecting line 10 which arises at the intersection between the generation plane 4 and the crystal lattice plane 6.

FIG. 15 shows a generation plane or modification plane which has regions with different modification concentrations 82, 84, 85, 86. It is conceivable for a multiplicity of regions having different modification concentrations to form a generation plane, it being likewise imaginable for the modifications 9 to be distributed in the generation plane substantially or exactly uniformly over the area. In terms of their area, the different modification concentrations may be formed with the same size or different sizes. With preference a first increased modification concentration represents a crack-initiating concentration 82, which is generated preferably in the region of the margin or extending toward the margin or neighboring the margin. Additionally or alternatively, a crack-guiding concentration 84 may be formed in such a way that the crack which separates the solid-state layer 2 from the solid-state body 1 is controllable. Additionally or alternatively, furthermore, it is possible to generate a center concentration 86, which preferably enables a very planar surface in the region of the center of the solid-state body 1. The crack-guiding concentration 84 is preferably partly or completely annular or surrounding in form, and therefore preferably surrounds the center of the solid-state body 1 or the solid-state layer 2 in sections, and more preferably completely. It is conceivable, additionally, for the crack-guiding concentration 84 to decrease gradually or continuously or fluidly starting from the margin of the solid-state body 1 and in the direction of the center of the solid-state body 1. Additionally it is conceivable for the crack-guiding concentration 84 to be strip-like and homogeneous or substantially or exactly homogeneous in form.

The crack profile preferably always follows the same pattern. After crack entry at the margin, the crack possesses a higher velocity along the margin than in the direction of the middle of the solid-state body. This means that the crack initially propagates to both sides (one to the left, the other to the right) of the margin (since it is there that the force effect is the greatest), and the two cracks meet again on the opposite side of the crack entry. Thereafter the fracture closes concentrically toward the middle. It is possible to exert an advantageous influence over the crack velocities by means of a stress field introduced. If, for example, the aim is to ensure that more stresses are present at the margin than in the middle, in order, for example, to promote the closing of the fracture, then longer microcracks and/or fewer laser modifications and/or more energy in the laser modifications in the marginal region are advantageous. It may equally be advantageous to generate greater stresses exactly in the middle of the laser modification plane, since it is there that the external force effect is smaller than at the margin. In that case, for example, in an inner radius of less than <7 cm, <5 cm, <3 cm, <1 cm, longer microcracks and/or fewer laser modifications and/or more energy ought advantageously to be introduced into the laser modifications than, for example, in a region different from this region.

The present invention therefore pertains to a method for generating microcracks in a donor substrate. This method preferably comprises at least the steps identified hereinafter: providing the donor substrate 1, where the donor substrate 1 comprises or consists of a crystalline material and where the donor substrate 1 comprises crystal lattice planes, where at least one extent direction of the crystal lattice planes is oriented with an inclination relative to a planar major surface 8, where the major surface 8 forms one boundary of the donor substrate 1 in the longitudinal direction of the donor substrate 1, generating modifications 9 in the interior of the specific donor substrate 1, to form a detachment region in the interior of the donor substrate 1, by means of a laser facility 29, where modifications 9 are generated along one line or two or more lines, more particularly parallel lines, to form modification lines 103, or where the modifications 9 are generated to form one modification line 103 or two or more modification lines, especially parallel modification lines 103, where the individual modifications 9 generate compressive stresses in the donor substrate, whereby the donor substrate 1, through the modification line 103 or the modification lines 103, undergoes cracking at least predominantly in the extent direction of the crystal lattice planes 6 that is inclined relative to the major surface 8, where the modifications 9 are generated per modification line 103 in such a way that, in the case of more than M crystal lattice dislocations (per cm$^2$) in the donor substrate 1, the crack per modification line 103 propagates less than 50 μm in the extent direction of the crystal lattice planes 6 that is inclined relative to the major surface 8, or where the modifications 9 are generated per modification line 103 in such a way that, in the case of fewer than O crystal lattice dislocations (per cm$^2$ or cm$^3$) in the donor substrate 1, the crack per modification line 103 propagates more than 100

μm, more particularly more than 200 μm or more than 250 μm or more than 300 μm or more than 350 μm, in the extent direction of the crystal lattice planes 6 that is inclined relative to the major surface 8, or where the modifications 9 are generated per modification line 103 in such a way that, in the case of more than O crystal lattice dislocations (per cm$^2$) in the donor substrate 1 and fewer than M crystal lattice mismatches (per cm$^2$) in the donor substrate 1, the crack per modification line 103 propagates between 50 μm and 100 μm, more particularly between 50 μm and 100 μm or 50 μm and 200 μm or 50 μm and 250 μm or 50 μm and 300 μm or 50 μm and 350 μm, in the extent direction of the crystal lattice planes that is inclined relative to the major surface, where O<M.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

LIST OF REFERENCE SYMBOLS 1 solid-state body/donor substrate
2 solid-state layer
4 generation plane
5 site for generation of modification
6 crystal lattice plane
6a/b/c crystal lattice planes
7 end of crystal lattice plane
8 major surface/first surface
9 modification
9a/b modifications
10 intersecting line
12 subcritical crack
11 flat
13 mechanical stresses
14 laser radiation
29 laser
30 repositioning facility
32 laser radiation
45 rotation facility
49 center
50 center of rotation
51 connecting section
52 direction
60 crystal lattice plane normal
80 major-surface normal
82 initiating modification concentration
84 margin modification concentration
85 codification concentration between the margin modification concentration and the center modification concentration
86 center modification concentration
90 normal plane
92 orthogonal plane to the normal plane
94 extent direction of the ends of the crystal lattice planes
103 laser line/writing line
115 chuck/carrier unit
117 curved surface
120 connecting point
122 body at least partially transparent for the laser radiation
200 solid-state layer surface exposed by separation
202 zigzag elevations
204 direction of the extent of the zigzag elevation/s
210 first direction
212 second direction (opposite to the first direction 210)
5700 light cone
5701 focus image
5702 focus image
5703 focus image
R longitudinal extent direction of the modification

What is claimed is:

1. A method, comprising:
    providing a semiconductor body having a generation plane and crystal lattice planes which intersect the generation plane at intersecting lines;
    generating modifications in the semiconductor body by multiphoton excitation and which are spaced apart from one another, the modifications altering a physical property of the semiconductor body so as to form subcritical cracks in the generation plane; and
    separating a solid-state layer from the semiconductor body by connecting the subcritical cracks in the generation plane.

2. The method of claim 1, wherein generating the modifications in the semiconductor body by multiphoton excitation comprises:
    using a same polarization to form a group of modifications oriented in a same direction.

3. The method of claim 1, wherein generating the modifications in the semiconductor body by multiphoton excitation comprises:
    using a first polarization to form a first group of modifications oriented in a first direction; and
    using a second polarization different than the first polarization to form a second group of modifications oriented in a second direction different than the first direction.

4. The method of claim 1, wherein generating the modifications in the semiconductor body by multiphoton excitation comprises:
    adjusting a polarization used to form a group of modifications so that an orientation of the modifications in the group deviate from one another.

5. The method of claim 1, wherein generating the modifications in the semiconductor body by multiphoton excitation comprises:
    adjusting a polarization for two or more groups of modifications so that the modifications of the at least two of the groups have an inclined orientation relative to the intersecting lines.

6. The method of claim 1, wherein generating the modifications in the semiconductor body by multiphoton excitation comprises:
    introducing laser radiation via a major surface into an interior of the semiconductor body to alter the physical property of the semiconductor body and form laser writing lines, each laser writing line corresponding to a group of the modifications.

7. The method of claim 6, wherein the laser writing lines are inclined relative to the intersecting lines.

8. The method of claim 6, wherein the semiconductor body is a silicon carbide wafer having a 4H polytype, the method further comprising:
    rotating a line writing direction of the laser radiation by 30°+/−3° relative to respective major axes of the silicon carbide wafer, such that a direction of the laser writing lines is oriented between two major axes of the silicon carbide wafer.

9. The method of claim 6, wherein the semiconductor body is a cubic silicon carbide wafer, the method further comprising:
rotating a line writing direction of the laser radiation by 22.5°+/−3° relative to respective major axes of the cubic silicon carbide wafer, such that a direction of the laser writing lines is oriented between two major axes of the cubic silicon carbide wafer.

10. The method of claim 6, wherein the semiconductor body is a gallium nitride wafer having a hexagonal wurtzite structure, the method further comprising:
rotating a line writing direction of the laser radiation by 30°+/−3° relative to respective major axes of the gallium nitride wafer, such that a direction of the laser writing lines is oriented between two major axes of the gallium nitride wafer.

11. The method of claim 6, wherein introducing laser radiation via the major surface into the interior of the semiconductor body comprises:
placing individual laser shots at defined distances to form the laser writing lines.

12. The method of claim 6, further comprising:
arranging the semiconductor body on a curved surface of a carrier unit such that the first surface of the semiconductor body into which the laser radiation is introduced has a concave or convex curvature.

13. The method of claim 6, further comprising:
placing a pressing body between a source of the laser radiation and the semiconductor body, so that the laser radiation for generating the modifications, before entry into the semiconductor body, passes through the pressing body which is at least partly transparent for the laser radiation, the pressing body generating additional stresses in the semiconductor body which counteract propagation of the subcritical cracks.

14. The method of claim 1, wherein separating the solid-state layer from the semiconductor body by connecting the subcritical cracks in the generation plane comprises:
applying an external force into the semiconductor body such that the subcritical cracks in the generation plane connect.

15. The method of claim 1, wherein separating the solid-state layer from the semiconductor body by connecting the subcritical cracks in the generation plane comprises:
altering an amount of material on the generation plane by laser radiation such that the subcritical cracks in the generation plane connect.

16. The method of claim 1, wherein the generation plane has regions with different modification concentrations.

17. The method of claim 6, further comprising:
adjusting the energy of the laser radiation based on a dislocation density of the semiconductor body.

18. A method, comprising:
providing a donor substrate having crystal lattice planes which are inclined relative to a planar major surface, the planar major surface forming a boundary of the donor substrate in a longitudinal direction of the donor substrate, with a crystal lattice plane normal being inclined in a first direction relative to a major-surface normal;
introducing laser radiation into an interior of the donor substrate by way of the major surface, such that a physical property of the donor substrate is altered in a region of at least one laser focus which is formed by laser beams emitted by a laser, the alteration of the physical property forming a structure through alteration of the site of penetration of the laser radiation into the donor substrate, a section of the structure that extends in a straight line being generated parallel to the major surface and extending in a second direction which, relative to the first direction, is inclined at an angle which is other than 90°, the altered physical property causing subcritical cracks to form in the donor substrate; and
removing a solid-state layer from the donor substrate by connecting the subcritical cracks in the donor substrate.

19. The method of claim 18, wherein removing the solid-state layer from the donor substrate by connecting the subcritical cracks in the donor substrate comprises:
by introducing an external force into the donor substrate to connect the subcritical cracks.

20. The method of claim 18, wherein removing the solid-state layer from the donor substrate by connecting the subcritical cracks in the donor substrate comprises:
altering material on a generation plane by laser radiation.

21. The method of claim 18, wherein the major surface of the donor substrate forms part of the solid-state layer separated from the donor substrate.

22. The method of claim 18, wherein the second direction is inclined relative to the first direction in an angle range between 45° and 87°.

23. The method of claim 18, wherein the structure formed through alteration of the site of penetration of the laser radiation into the donor substrate is inclined relative to ends of the crystal lattice plane or relative to an intersecting line which arises at an intersection between a generation plane and the crystal lattice plane.

24. The method of claim 18, further comprising:
rotating the donor substrate relative to the laser such that the structure formed through alteration of the site of penetration of the laser radiation into the donor substrate is generated in the form of an arc or is curved.

25. The method of claim 18, further comprising:
adjusting the energy of the laser radiation based on a dislocation density of the donor substrate.

* * * * *